(12) United States Patent
Schwarzmaier et al.

(10) Patent No.: US 12,176,464 B2
(45) Date of Patent: Dec. 24, 2024

(54) METHOD FOR PRODUCING AN OPTOELECTRONIC COMPONENT, AND OPTOELECTRONIC COMPONENT

(71) Applicant: Osram OLED GmbH, Regensburg (DE)

(72) Inventors: Christoph Schwarzmaier, Regensburg (DE); Martin Mandl, Lorenzen (DE); Robert Walter, Parsberg (DE); Roland Stieglmeier, Lupburg (DE); Michael Schmal, Schmidmuehlen (DE)

(73) Assignee: OSRAM OLED GMBH, Regensburg (DE)

( * ) Notice: Subject to any disclaimer, the term of this patent is extended or adjusted under 35 U.S.C. 154(b) by 103 days.

(21) Appl. No.: 16/753,366

(22) PCT Filed: Sep. 26, 2018

(86) PCT No.: PCT/EP2018/076107
§ 371 (c)(1),
(2) Date: Apr. 3, 2020

(87) PCT Pub. No.: WO2019/068534
PCT Pub. Date: Apr. 11, 2019

(65) Prior Publication Data
US 2020/0274031 A1  Aug. 27, 2020

(30) Foreign Application Priority Data
Oct. 5, 2017  (DE) .................. 10 2017 123 154.4

(51) Int. Cl.
*H01L 33/00* (2010.01)
*H01L 33/40* (2010.01)
*H01L 33/46* (2010.01)

(52) U.S. Cl.
CPC ........ *H01L 33/405* (2013.01); *H01L 33/0075* (2013.01); *H01L 33/0095* (2013.01);
(Continued)

(58) Field of Classification Search
CPC .............................................. H01L 2933/0016
See application file for complete search history.

(56) References Cited

U.S. PATENT DOCUMENTS 11,515,451 B2 * 11/2022 Oh ........................ H01L 33/46
2004/0259278 A1  12/2004 Illek et al.
(Continued)

FOREIGN PATENT DOCUMENTS

| CN | 1976075 A | 6/2007 |
| CN | 1976076 A | 6/2007 |

(Continued)

OTHER PUBLICATIONS

Machine translation of Katz et al., WO-2015078916 (Year: 2015).*
(Continued)

*Primary Examiner* — Hsin Yi Hsieh
(74) *Attorney, Agent, or Firm* — VIERING, JENTSCHURA & PARTNER mbB

(57) ABSTRACT

A method for producing an optoelectronic component by providing a semiconductor layer sequence on a substrate where the semiconductor layer sequence is configured to emit radiation. The method may further include applying a contact layer to the semiconductor layer sequence where the contact layer has a layer thickness of at most 10 nm. The method may further include applying a reflective layer to the contact layer and applying a barrier layer directly to the reflective layer.

13 Claims, 28 Drawing Sheets

(52) U.S. Cl.
CPC ...... *H01L 33/46* (2013.01); *H01L 2933/0016* (2013.01); *H01L 2933/0025* (2013.01)

(56) References Cited

U.S. PATENT DOCUMENTS

| | | | |
|---|---|---|---|
| 2006/0255341 A1* | 11/2006 | Pinnington | ............ B82Y 20/00 |
| | | | 257/E33.068 |
| 2007/0138487 A1 | 6/2007 | Watanabe et al. | |
| 2007/0145396 A1 | 6/2007 | Watanabe et al. | |
| 2008/0006836 A1* | 1/2008 | Lee | ....................... H01L 33/405 |
| | | | 257/E33.068 |
| 2008/0230904 A1* | 9/2008 | Lee | ................... H01L 21/28575 |
| | | | 438/653 |
| 2010/0207096 A1 | 8/2010 | Tang et al. | |
| 2011/0031472 A1 | 2/2011 | Tang et al. | |
| 2011/0089452 A1 | 4/2011 | Jeong et al. | |
| 2011/0316028 A1 | 12/2011 | Strassburg et al. | |
| 2013/0069095 A1* | 3/2013 | Hodota | ................... H01L 33/42 |
| | | | 257/E33.072 |
| 2013/0092955 A1* | 4/2013 | Chiou | ................... H01L 33/405 |
| | | | 257/E33.008 |
| 2013/0146910 A1 | 6/2013 | Maute et al. | |
| 2014/0061701 A1* | 3/2014 | Matsuura | ............... H05B 33/26 |
| | | | 428/141 |
| 2017/0352535 A1 | 12/2017 | Hertkorn | |
| 2020/0220049 A1* | 7/2020 | Oh | .......................... H01L 33/46 |

FOREIGN PATENT DOCUMENTS

| | | | | |
|---|---|---|---|---|
| CN | 102017192 A | 4/2011 | | |
| CN | 102119449 A | 7/2011 | | |
| CN | 102187484 A | 9/2011 | | |
| DE | 10307280 A1 | 6/2004 | | |
| DE | 102010009717 A1 | 9/2011 | | |
| DE | 202010017388 U1 | 10/2011 | | |
| DE | 102014116999 A1 | 5/2016 | | |
| TW | 201603320 A | 1/2016 | | |
| WO | WO-2015078916 A1 * | 6/2015 | ............. | H01L 33/14 |

OTHER PUBLICATIONS

International Search Report issued for the corresponding PCT-Application No. PCT/EP2018/076107, dated Dec. 11, 2018, 15 pages (for informational purpose only).

German Search Report issued for the corresponding DE-Application No. 10 2017 123 154.4, dated Aug. 2, 2018, 8 pages (for informational purpose only).

Office Action for corresponding Chinese patent application No. 201880065113.6, dated Dec. 28, 2022, 14 pages.

S.M. Sze, "Semiconductor Devices: Physics and Technology", translated by Zhao Heming, Suzhou University Press, 2022, p. 380, line 3.

Chinese office action issued for the corresponding Chinese patent application No. 201880065113.6, dated Jan. 19, 2024, 5 pages (for informational purposes only).

* cited by examiner

A)

B)

C)

D)

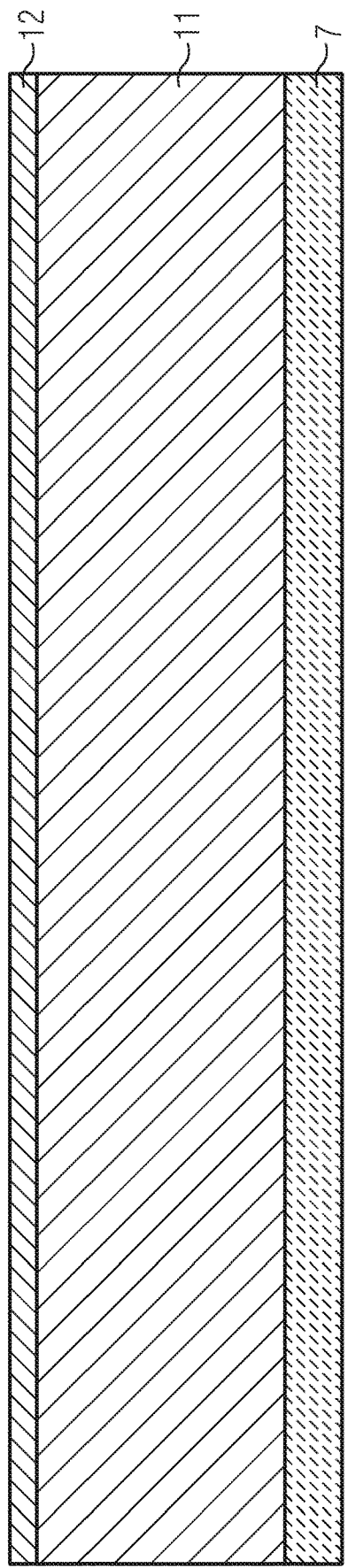

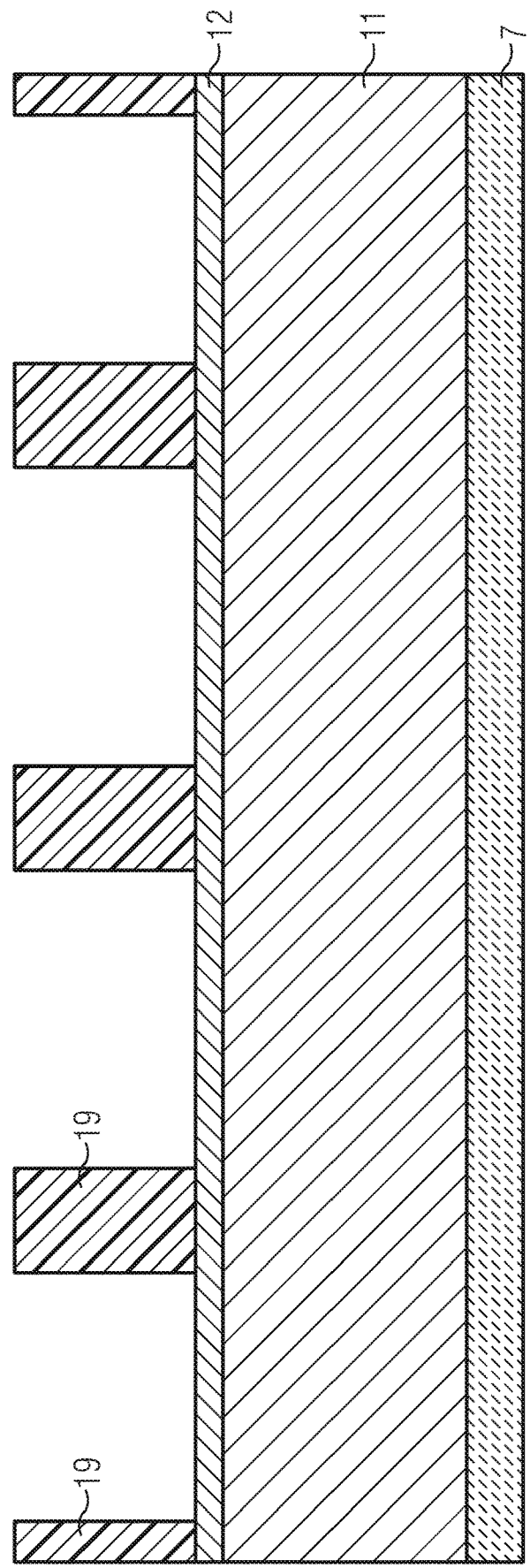

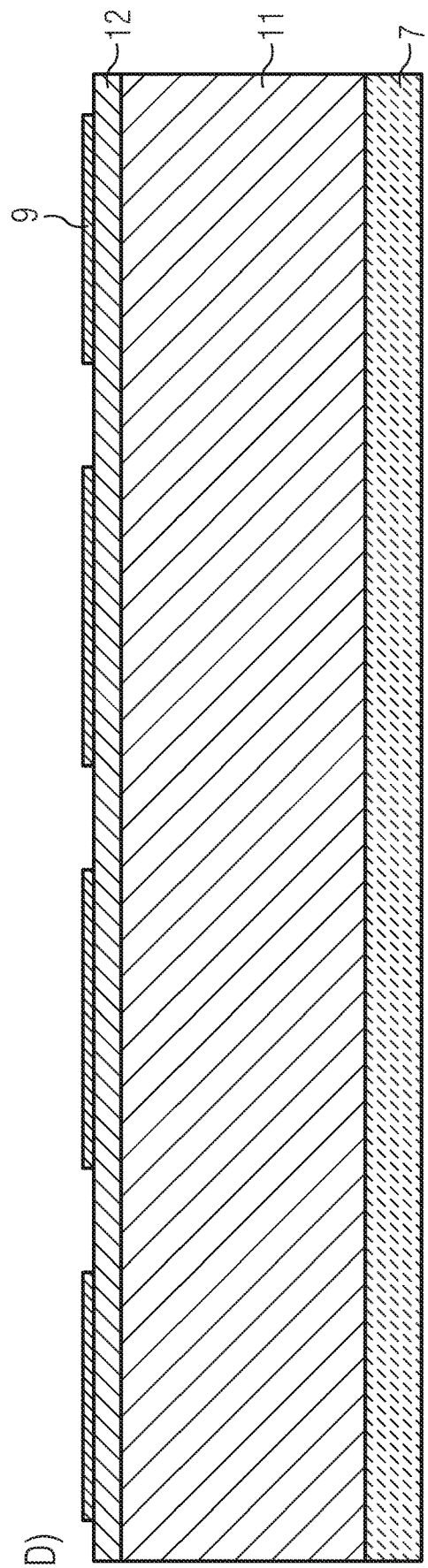

G)

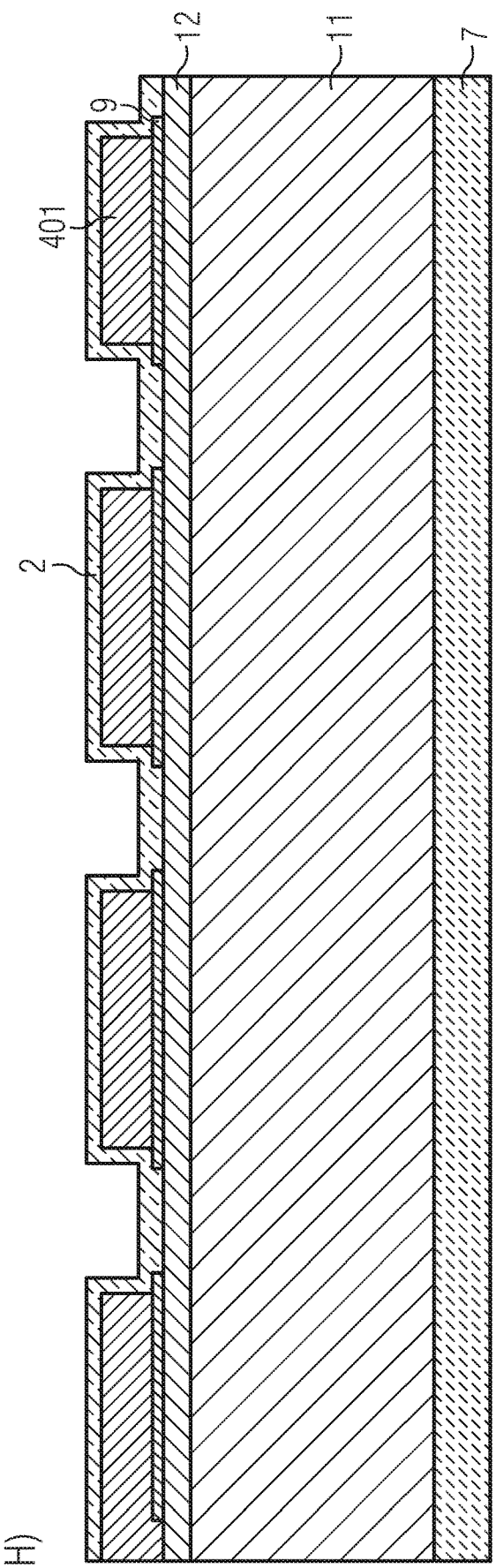

j)

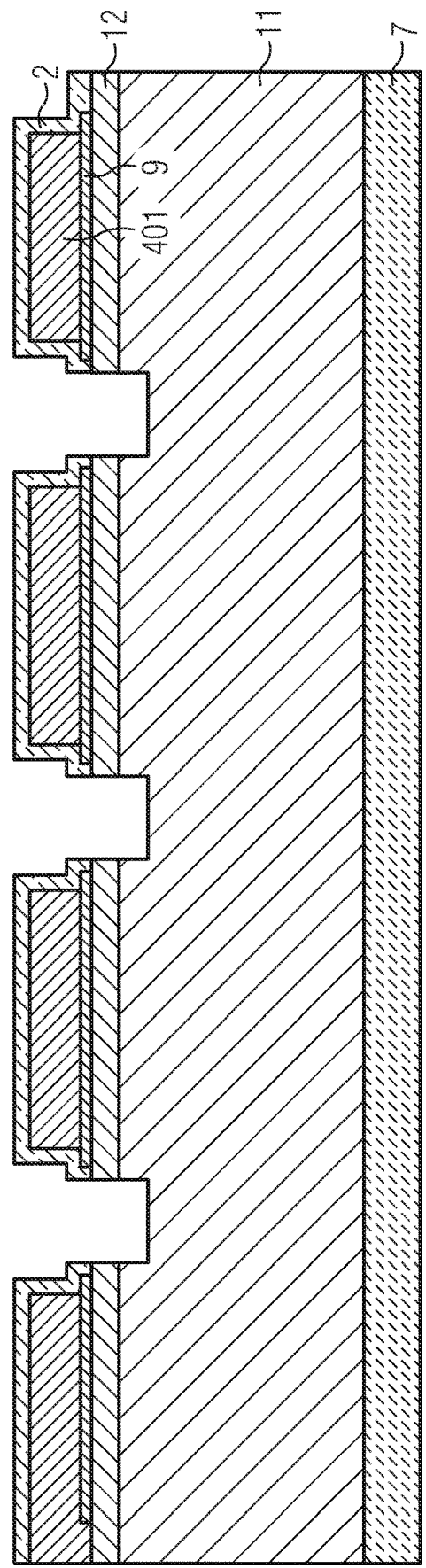

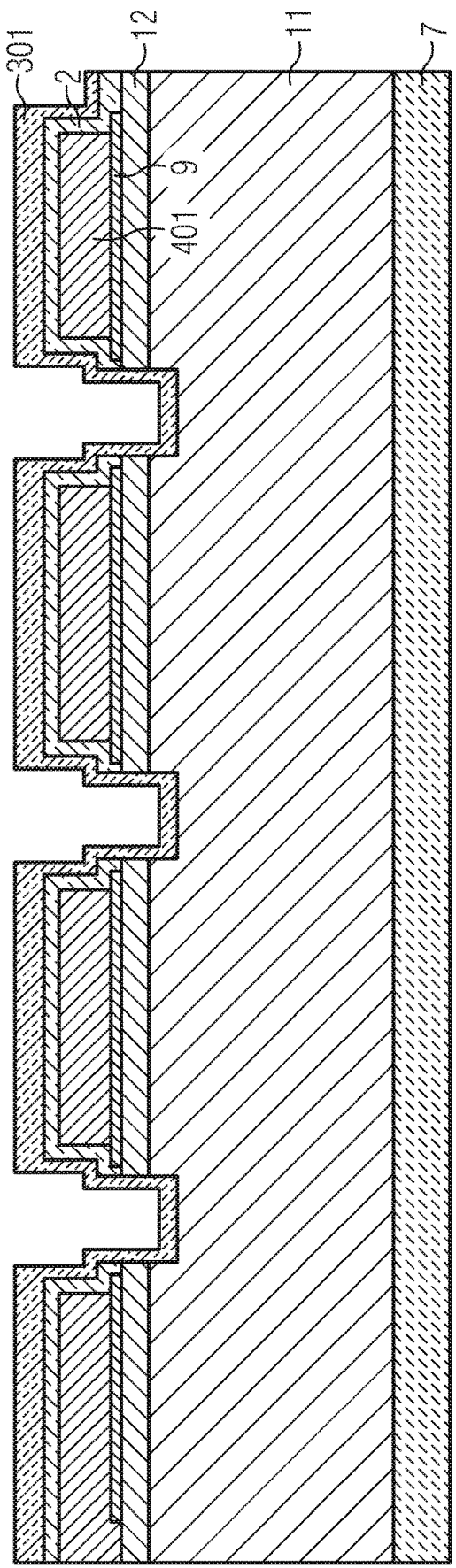

(M)

N)

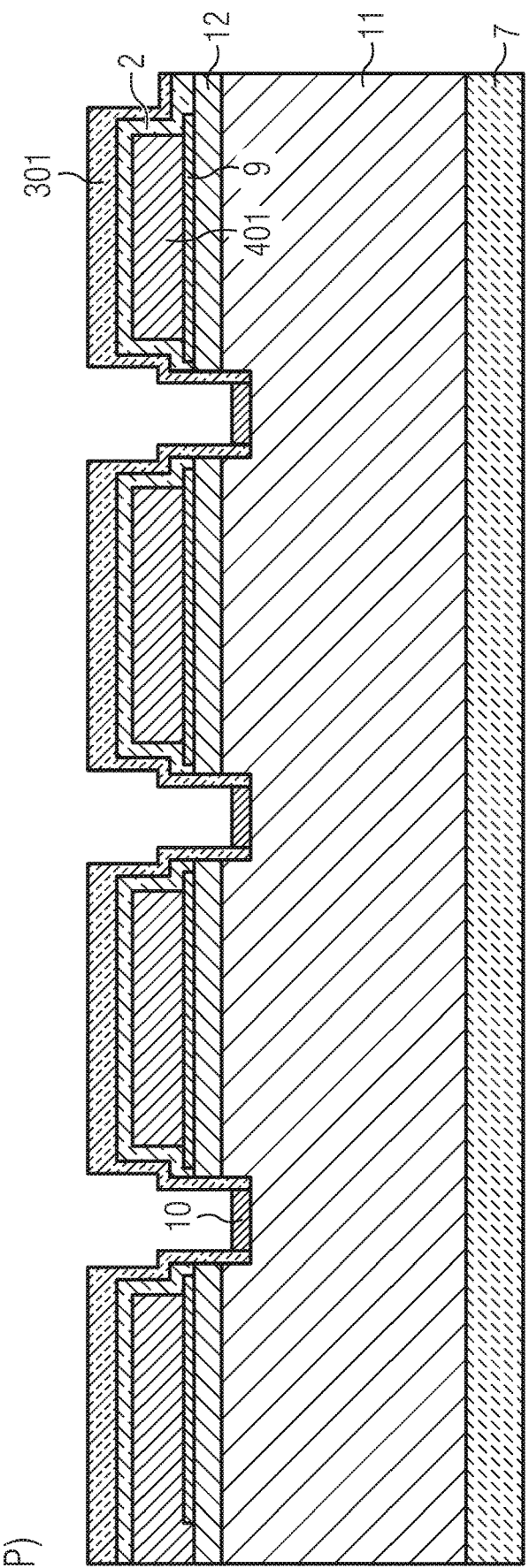

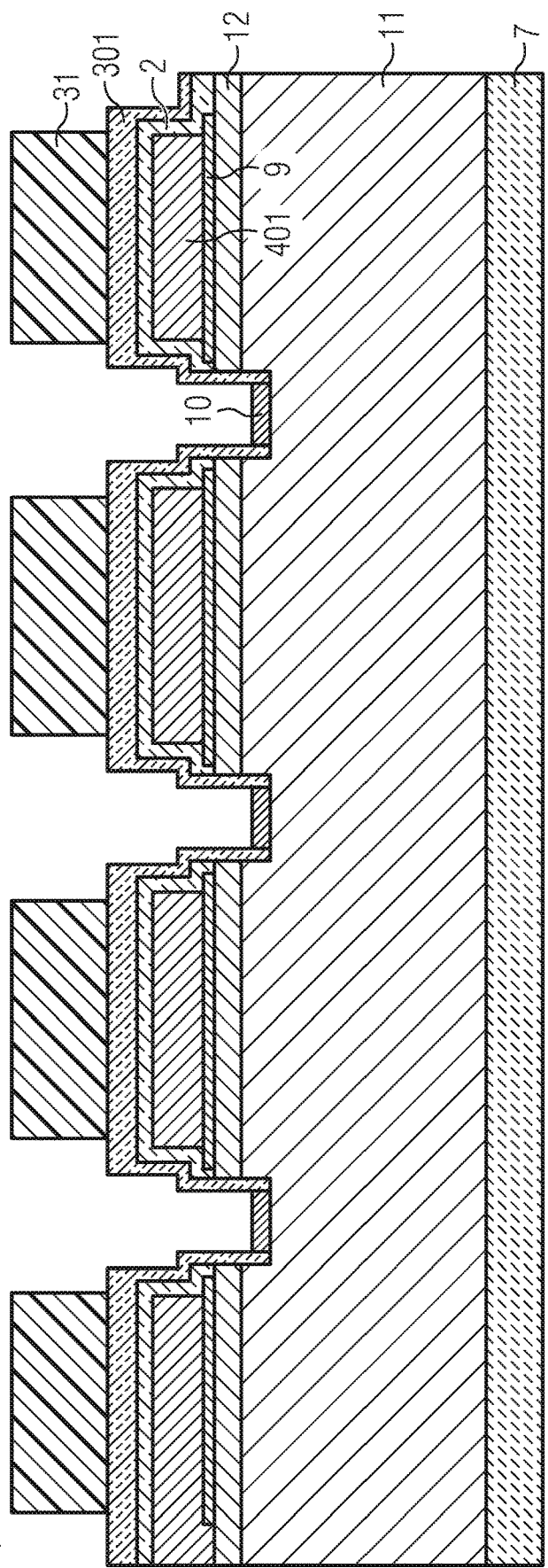

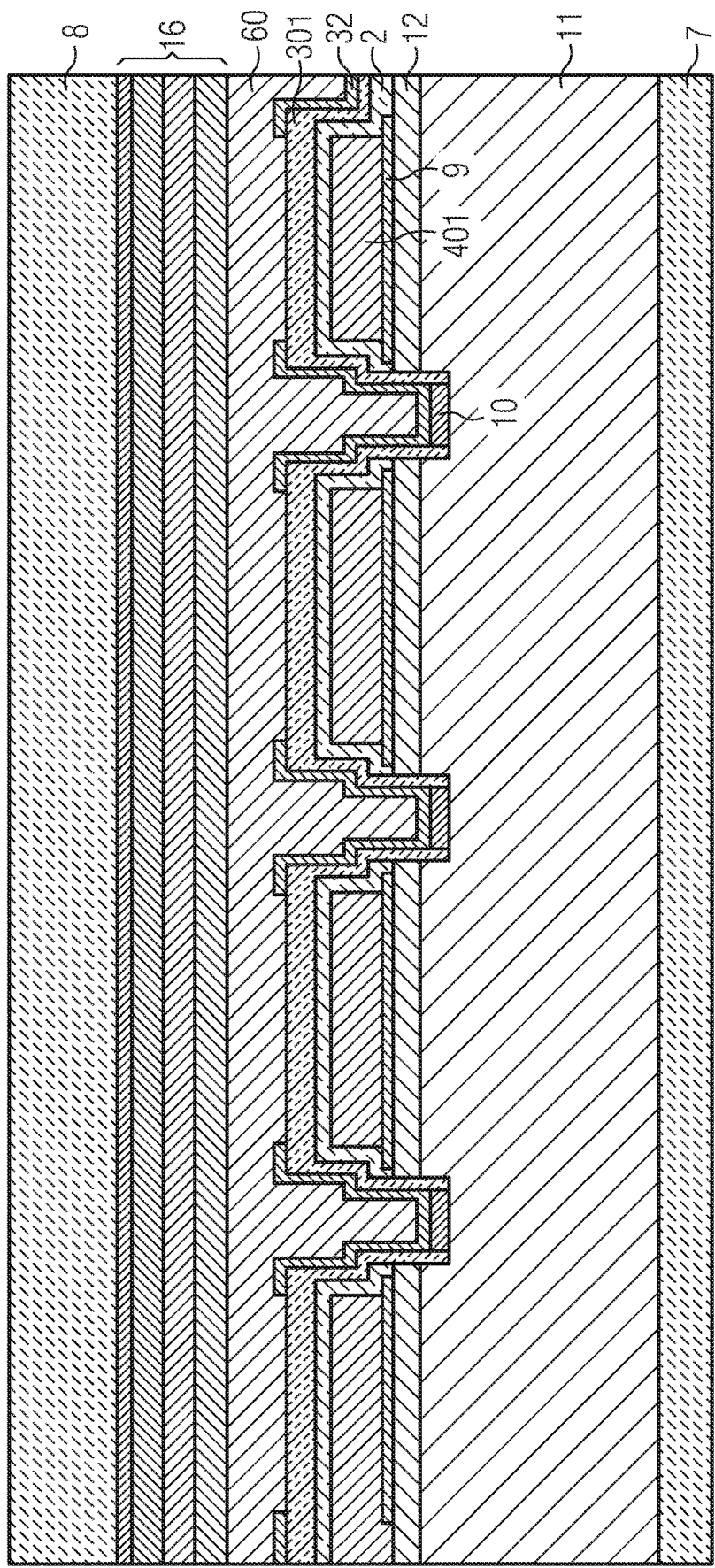

V)

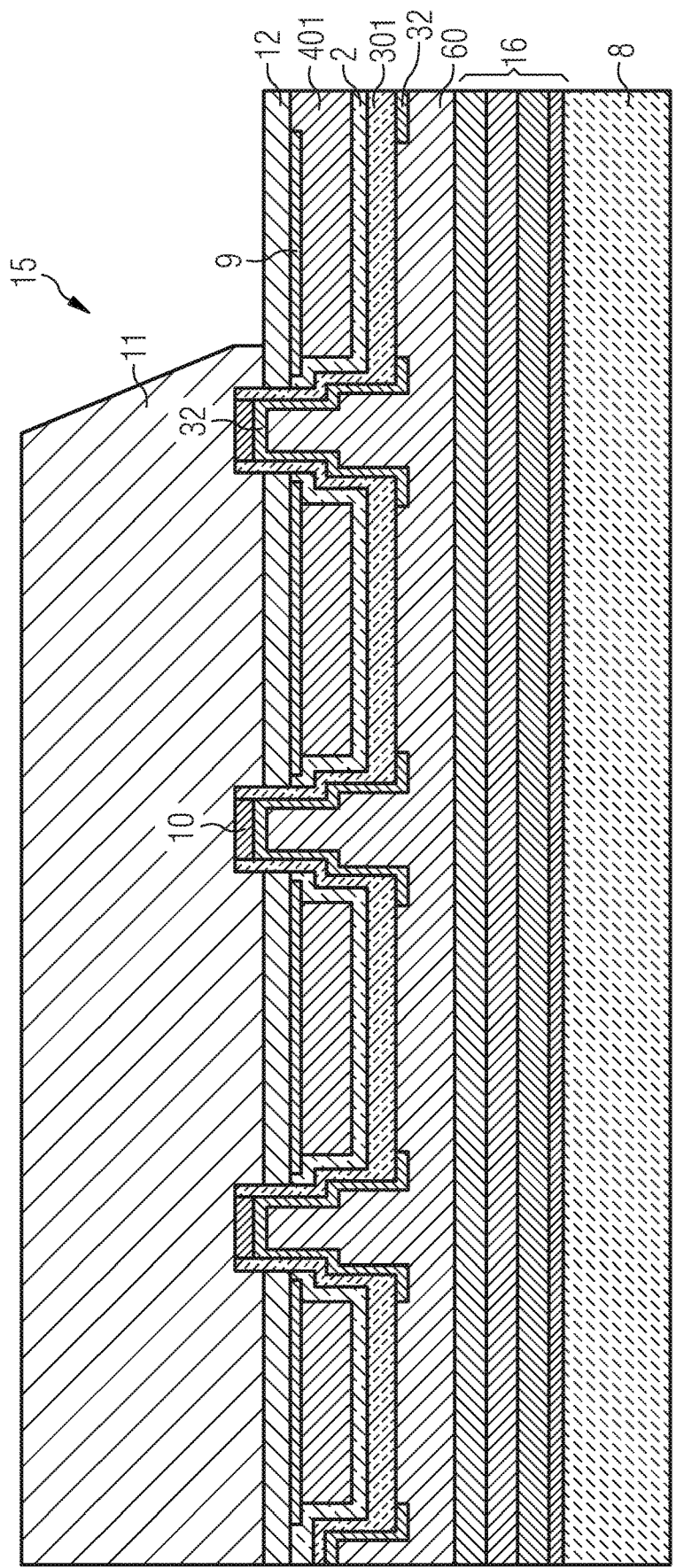

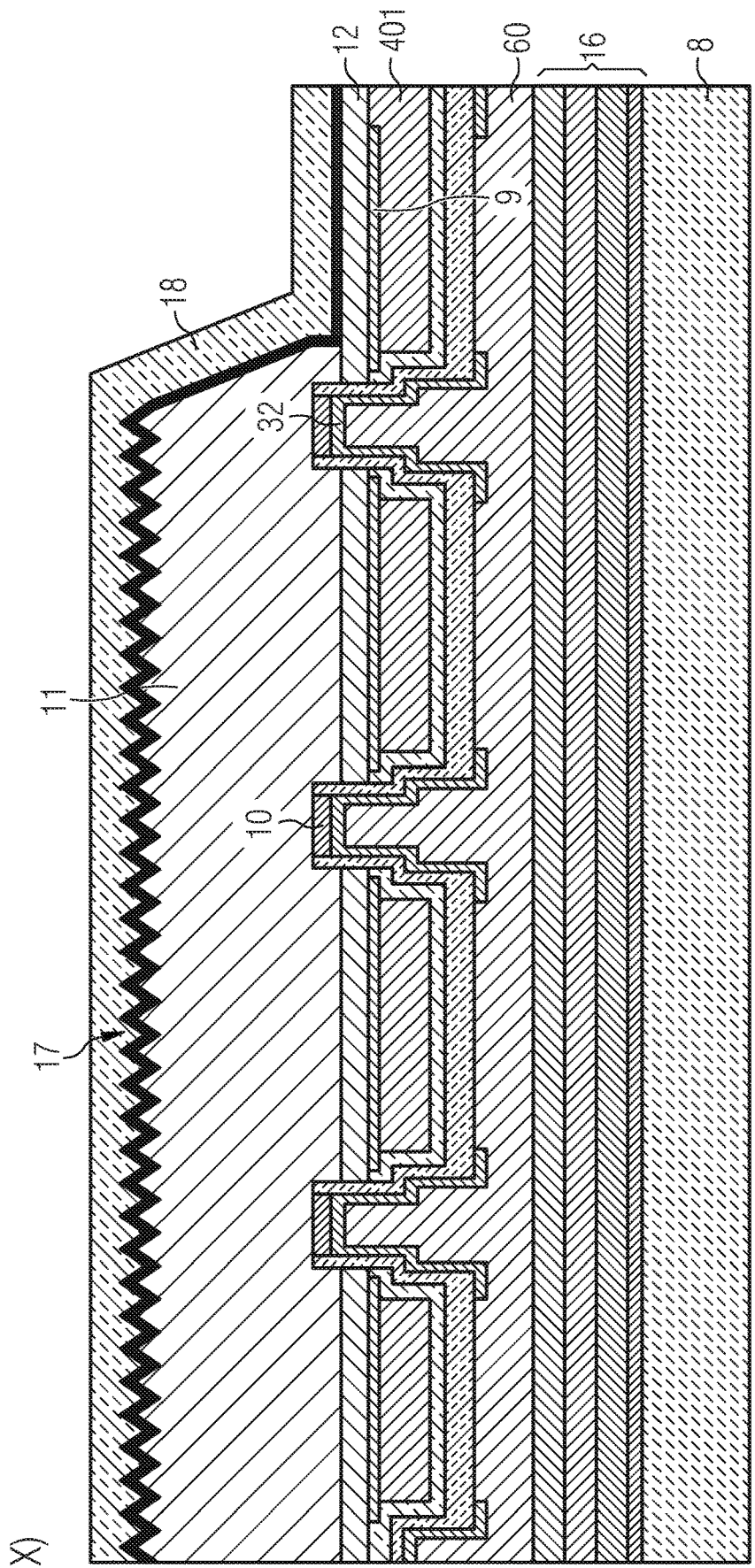

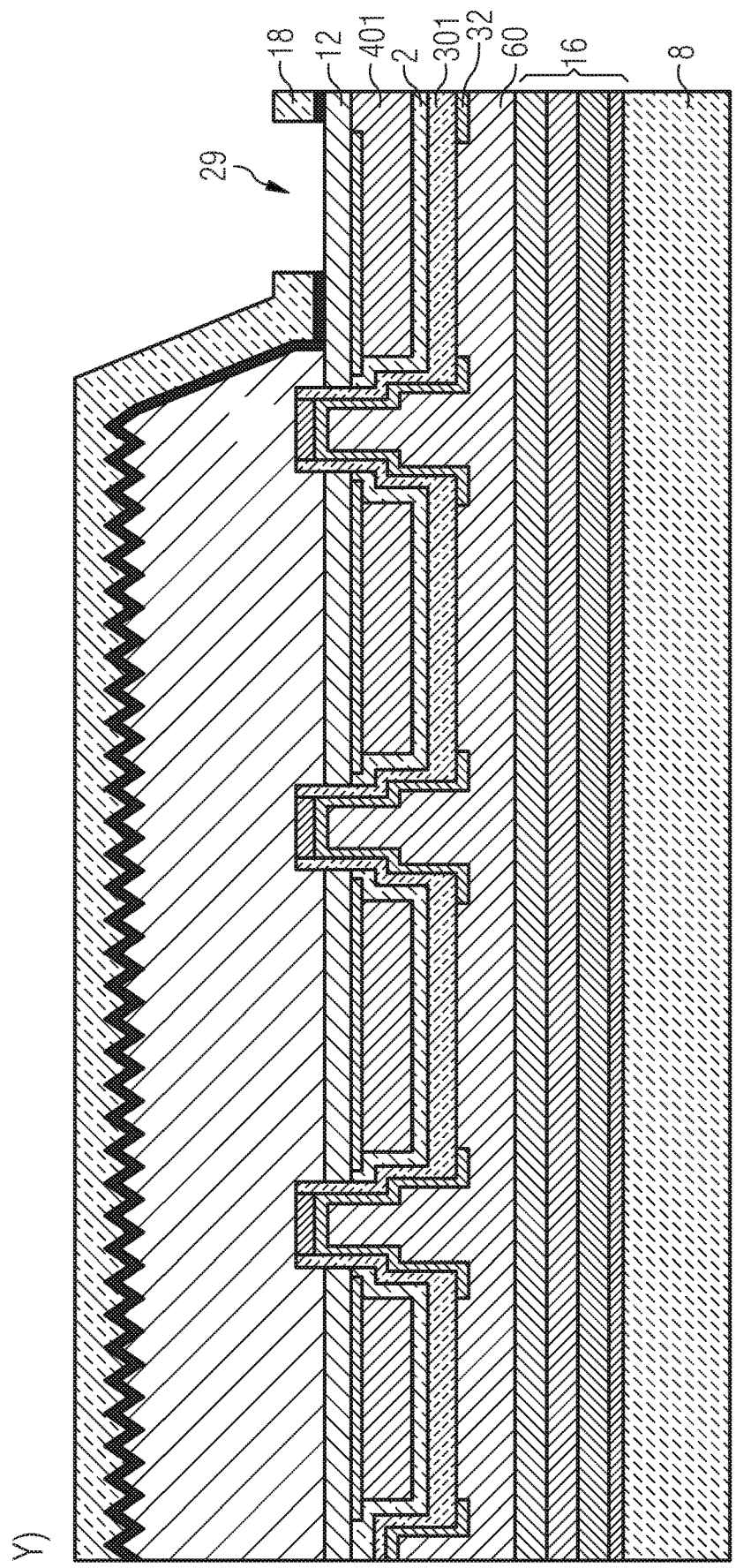

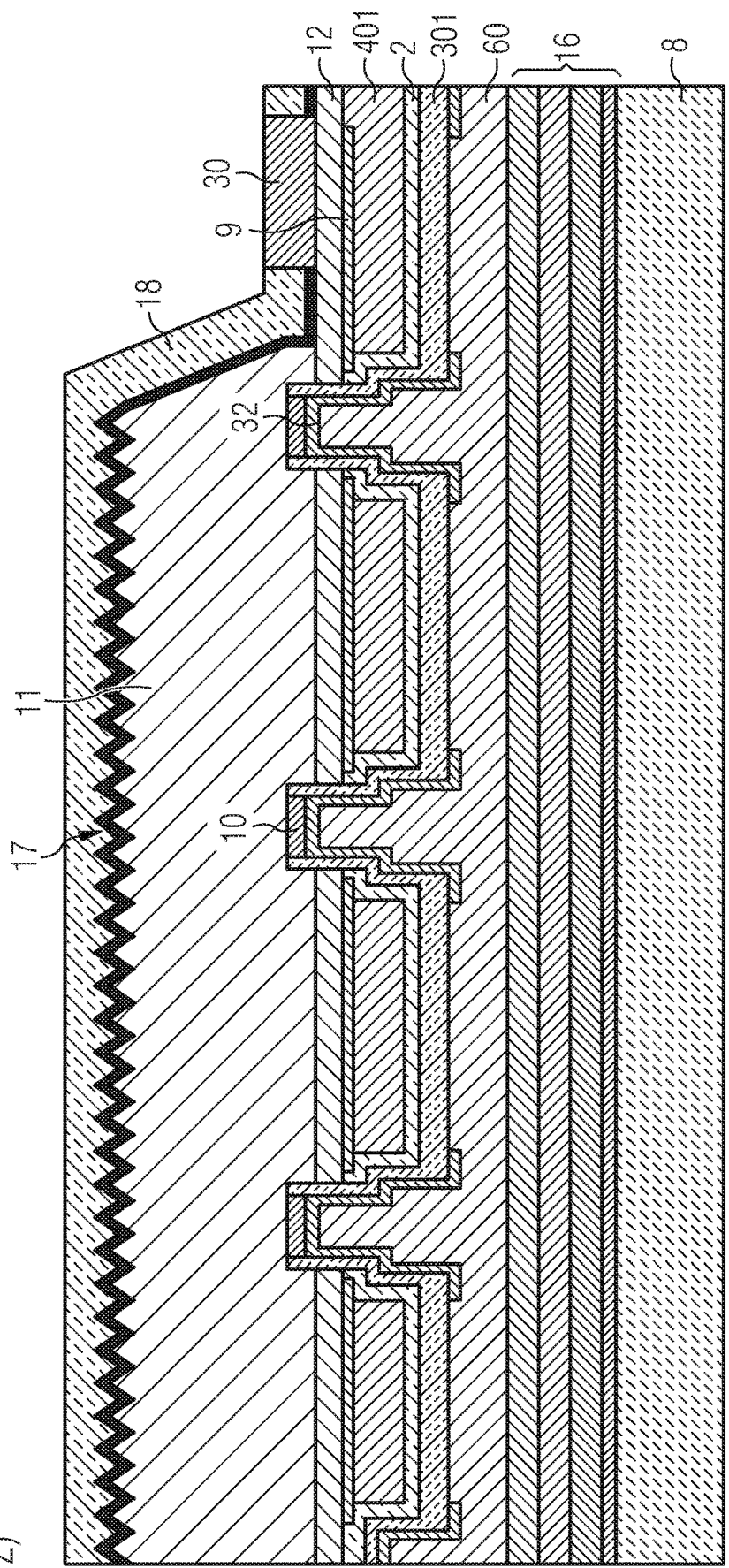

A)

B)

C)

D)

METHOD FOR PRODUCING AN OPTOELECTRONIC COMPONENT, AND OPTOELECTRONIC COMPONENT

CROSS-REFERENCE TO RELATED APPLICATION

The present application is a national stage entry according to 35 U.S.C. § 371 of PCT application No.: PCT/EP2018/076107 filed on Sep. 26, 2018; which claims priority to German Patent Application Serial No.: 10 2017 123 154.4, which was filed on Oct. 5, 2017; which are incorporated herein by reference in their entirety and for all purposes.

TECHNICAL FIELD

The description relates to a method for producing an optoelectronic component. The description furthermore relates to one optoelectronic component.

BACKGROUND

Optoelectronic components, in particular light-emitting diodes (LEDs) based on indium gallium nitride, comprise silver on the p-side of the epitaxial layer, which acts as a compact and as a mirror. The structure of the deposited layer in this case determines the contact resistance and the brightness of the LED, and therefore directly the efficiency. In addition to the deposition, a heat-treatment step may lead to the structure of the mirror material being modified and diffusion processes of underlying materials taking place, which modify both the contact resistance and the reflectivity to limitedly controllable extents.

It is an object to provide a method for producing a respective optoelectronic component, which has a homogeneous light pattern and/or a good forward voltage. In particular, the optoelectronic component produced has a good brightness.

SUMMARY

In at least one embodiment, the method for producing an optoelectronic component comprises the steps A) to D), particularly in the order indicated here:
A) providing a semiconductor layer sequence,
B) applying a contact layer, which prevents or reduces diffusion of the material of a mirror layer, directly onto the semiconductor layer sequence, the contact layer having a layer thickness of at most 10 nm,
C) applying the mirror layer directly onto the contact layer, and
D) applying a barrier layer directly onto the mirror layer. The semiconductor layer sequence is arranged on a carrier. The semiconductor layer sequence is adapted for radiation emission. The semiconductor layer sequence comprises at least one n-doped semiconductor layer, at least one p-doped semiconductor layer and an active layer arranged between the n- and p-doped semiconductor layers.

As an alternative or in addition, instead of preventing or reducing the diffusion of the material of a mirror layer, the contact layer may on the one hand influence the growth behavior and the crystal orientation of further layers and, on the other hand, modify the species involved in contact in their composition.

According to at least one embodiment, the method comprises a step A) of providing a semiconductor layer sequence. The semiconductor layer sequence is applied on a carrier. The semiconductor layer sequence comprises at least one n-doped semiconductor layer, at least one p-doped semiconductor layer and an active layer arranged between the n- and p-doped semiconductor layers. The semiconductor layer sequence is based on a III-V compound semiconductor material. In the present context, "based on a III-V compound semiconductor material" means that the semiconductor layer sequence or at least one layer thereof comprises a III nitride compound semiconductor material, such as $In_xAl_yGa_{1-x-y}N$, where $0 \leq x \leq 1$, $0 \leq y \leq 1$ and $x+y \leq 1$. In this case, the material need not necessarily have a mathematically exact composition according to the formula above. Rather, it may comprise one or more dopants and additional constituents which substantially do not modify the characteristic physical properties of the $In_xAl_yGa_{1-x-y}N$ material. For the sake of simplicity, however, the formula above contains only the essential constituents of the crystal lattice (In, Al, Ga, N), even though these may be partially replaced with small amounts of further substances.

The semiconductor layer sequence contains an active layer having at least one pn junction and/or having one or having a plurality of quantum well structures. During operation of the component, electromagnetic radiation is generated in the active layer. A wavelength of the radiation lies in the ultraviolet and/or visible range, in particular at wavelengths of between 420 nm inclusive and 680 nm inclusive, for example between 440 nm inclusive and 480 nm inclusive.

According to at least one embodiment, the optoelectronic component is a light-emitting diode, abbreviated to LED. The component is then adapted to emit ultraviolet, blue, yellow, green, red, orange or white light.

According to at least one embodiment, the optoelectronic component comprises a carrier. For example, a sapphire carrier may be used as the carrier. As an alternative, the carrier may for example comprise silicon, silicon carbide, aluminum nitride or gallium nitride.

The carrier may be removed in a subsequent method step. In a non-limiting embodiment, the carrier is removed and a substrate, which is for example formed from silicon, is integrated into the optoelectronic component. In a non-limiting embodiment, the substrate is arranged on the semiconductor layer sequence on the opposite side from the carrier.

According to at least one embodiment, the method comprises a step B) of applying a contact layer. The contact layer is applied directly onto the semiconductor layer sequence. In a non-limiting embodiment, the contact layer is applied directly onto the p-doped semiconductor layer. Here and in what follows, "directly" refers to unmediated arrangement of the contact layer on the semiconductor layer sequence, such as on the p-doped semiconductor layer sequence. This means, in particular, that no further layers or elements are arranged between the semiconductor layer sequence and the contact layer.

According to at least one embodiment, the contact layer is applied surface-wide directly onto the semiconductor layer sequence. The contact layer leads to a modified growth of subsequent layers, which are arranged on the contact layer. In this case, for example, the contact layer modifies the crystal orientation and also influences the species involved in the contact and their composition.

According to at least one embodiment, the contact layer has a layer thickness of at most 10 nm, 9 nm, 8 nm, 7 nm, 6 nm, 5 nm, 4 nm, 3 nm, 2 nm, 1 nm, 0.5 nm, 0.1 nm, 0.05 nm or 0.01 nm. In addition, the minimum layer thickness may be at least 0.001 nm. The specification of the layer thickness relates, particularly in the case of layer thicknesses of less than 0.1 nm, to an average thickness over the entire surface.

According to at least one embodiment, the method comprises a step C) of applying a mirror layer directly onto the contact layer. The mirror layer may be applied surface-wide or in a structured fashion. As an alternative, the mirror layer may also be applied surface-wide and subsequently structured. This also applies for the contact layer.

According to at least one embodiment, the method comprises a step D), of applying a barrier layer directly onto the mirror layer. In a non-limiting embodiment, the component then comprises an arrangement in the direction away from the carrier of a contact layer, directly following mirror layer and directly following barrier layer.

In a non-limiting embodiment, the contact layer, the mirror layer and the barrier layer are arranged in a structured fashion on the semiconductor layer sequence.

According to at least one embodiment, the barrier layer comprises the same material as the contact layer. For example, zinc or zinc oxide may be used as the material of the contact layer and/or barrier layer.

According to at least one embodiment, Pt, Ni, Zn, ZnO or ITO is used as the material of the contact layer. As an alternative or in addition, ZnO, TiW, Ti, Pt or Ni may be used as the material of the barrier layer.

According to at least one embodiment, the layer thickness of the contact layer is less than the layer thickness of the barrier layer.

According to at least one embodiment, the layer thickness of the contact layer is less than the layer thickness of the barrier layer at least by the factor 1/20.

According to at least one embodiment, the layer thickness of the contact layer is between 0.05 nm and 3 nm, for example 2 nm or 2.5 nm.

According to at least one embodiment, the mirror layer is formed from silver.

According to at least one embodiment, the contact layer is configured as a monolayer or surface-wide monolayer. Here and in what follows, monolayer means that the layer thickness of the contact layer is in the monolayer range. For example, the layer thickness of the monolayer is between 0.5 nm and 3 nm. In other words, a monolayer is intended to mean that the layer thickness is only one atom or molecule.

As an alternative or in addition to, the monolayer may comprise gaps or islands, so that the monolayer does not form a continuous layer. This is the case, in particular, for small layer thicknesses d<D(atom).

"Surface-wide" may mean that the monolayer is configured as a homogeneous layer and does not have any interruptions. This does not, however, exclude the possibility that the monolayer formed surface-wide may also be structured. In particular, the structured regions of the monolayer are then respectively configured as a homogeneous layer.

According to at least one embodiment, the contact layer is configured in a structured fashion and is applied directly onto the p-doped semiconductor layer. The contact layer may also be arranged directly after the mirror layer. The mirror layer comprises, in particular, the same structuring as the contact layer.

According to at least one embodiment, the mirror layer comprises a reflective material. In particular, the reflectance of the mirror layer is more than 90%, in particular more than 95%, such as more than 99%.

According to at least one embodiment, the mirror layer is configured as a dielectric mirror or as a combination of metallic and dielectric mirrors, in particular Ag and DBR (distributed Bragg reflector).

According to at least one embodiment, the semiconductor layer sequence comprises indium gallium nitride or gallium nitride or a combination thereof.

According to at least one embodiment, the mirror element at the same time forms the p-terminal contact for contacting of the p-doped semiconductor layer and/or an element for mirroring or reflection.

According to at least one embodiment, the contact layer and barrier layer comprise different materials or different material compositions.

According to at least one embodiment, the contact layer is produced by means of sputtering.

The inventors have discovered that before the deposition of the mirror layer, which in particular is formed from silver, on the semiconductor layer sequence, which in particular is formed from gallium nitride, thin layers of the contact layer, for example of zinc or zinc oxide, should be arranged. The contact layer has a layer thickness of between 0.05 nm and 3 nm. The contact, which may also already be produced by diffusion processes, is deposited precisely in a controlled way. By the direct deposition of the actual contact materials, decoupling of the contact formation from conditions that are difficult to control, for example the grain size and the defect distribution inside the mirror element, for example inside the silver, may be achieved. By this process flow, besides more exact specification of the contact composition, the bonding conditions on the contact may also be defined in a more controlled way. Both allow more exact control of the contact resistance.

On the other hand, this procedure allows greater decoupling of the contact definition from subsequent processes and layers. These may be adapted better to the respective requirements. For example, during the deposition of the silver of the mirror layer, the process may be optimized above all with a view to the reflectivity and leaktightness, without detrimentally affecting the p-terminal contact. In this way, the forward voltage and reflectivity may be modified independently of one another in a controlled way.

Furthermore, the zinc oxide, hitherto used as a barrier, of the barrier layer may be replaced with more suitable materials that prevent diffusion of silver in the direction of a subsequent metallization more reliably than in the past, and which protect the actual contact layer better from subsequent process steps. As materials for the replacement of zinc oxide, conductive metal nitrides of the general composition $M_xN_y$ (M=metal) with $0<x<1$ and $0<y<1$ may be used. The following materials may be used: Pt, Ni, TiW, Ti, Zn, Cr, Hf, V, Ru, Ta, TaN, TiN.

In this way, the complex interactions of the process chain may be minimized. The contact layer and/or barrier layer, which are formed in particular from zinc or zinc oxide, are used as a growth layer for the subsequent mirror layer and influence its properties, such as its grain size distribution and orientation, and may be used as further parameters for optimization of the mirror layer. With the deposition of the contact layer and/or barrier layer, in particular the deposition process of the sensitive p-doped semiconductor layer, in particular of gallium nitride, which is caused for example by highly energetic ions, is burdened less.

According to at least one embodiment, evaporation or sputtering processes may be used as the deposition method.

The optoelectronic component described here is produced by the method described here. In this case, all definitions and comments for the method also apply for the optoelectronic component, and vice versa.

According to at least one embodiment, the method for producing an optoelectronic component comprises the steps A) to D), particularly in the order indicated here:
- A) providing a semiconductor layer sequence on a carrier, the semiconductor layer sequence being adapted for radiation emission, the semiconductor layer sequence comprising at least one n-doped semiconductor layer, at least one p-doped semiconductor layer and an active layer arranged between the n- and p-doped semiconductor layers,
- B) applying a mirror layer onto the semiconductor layer sequence,
- C) applying a barrier layer directly onto the mirror layer, the barrier layer comprising a transparent conductive oxide, in particular zinc oxide, or a metal, in particular zinc,
- D) heat-treating the arrangement produced in step C), the transparent conductive oxide diffusing at least partially through the mirror layer and being deposited as a layer on the semiconductor layer sequence, such as. as a monolayer, so that a contact layer is formed. The contact layer has a layer thickness of at most 10 nm, such as between 0.05 nm and 3 nm, and the layer thickness of the contact layer being less than the layer thickness of the barrier layer.

According to at least one embodiment, the contact layer is configured as a surface-wide monolayer. In a subsequent method step, the monolayer formed surface-wide may be structured so that structured regions of the contact layer are produced on the semiconductor layer sequence.

The Inventors have discovered that by the method described here, independent optimization of the p-contact resistance, of the mirror reflectivity and of the barrier may be carried out. Furthermore, the method leads to a component having a homogeneous and controlled distribution of the forward voltage. The brightness of the component may be increased. At the same time, the method comprises a stable process sequence and minimization of complex interactions.

BRIEF DESCRIPTION OF THE DRAWINGS

Further advantages, advantageous embodiments and refinements may be found by way of non-limiting examples described below in connection with the figures.

DETAILED DESCRIPTION

In the exemplary embodiments and figures, elements which are the same or of the same type, or which have the same effect, may respectively be provided with the same references. The elements represented and their size proportions with respect to one another are not to be regarded as true to scale. Rather, individual elements, for example layers, component parts, components and regions, may be represented exaggeratedly large for better representability and/or for better understanding.

FIGS. 1A to 1D show a method for producing an optoelectronic component 100 according to one embodiment.

Figure 1:
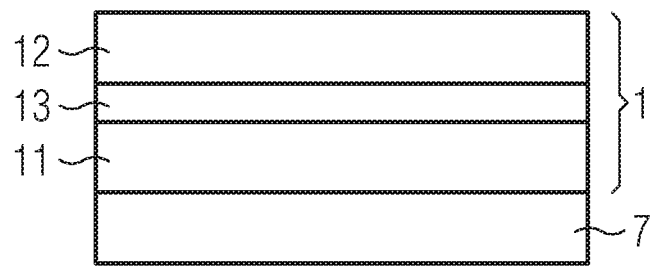
FIGS. 1A to 1D show a method for producing an optoelectronic component according to one embodiment.
Figure 1:
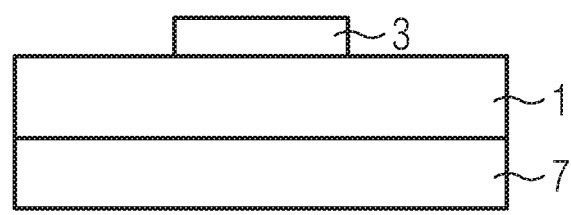
Figure 1:
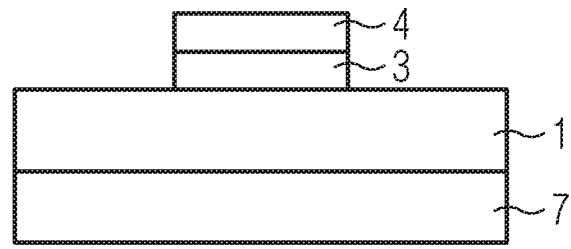
Figure 1:
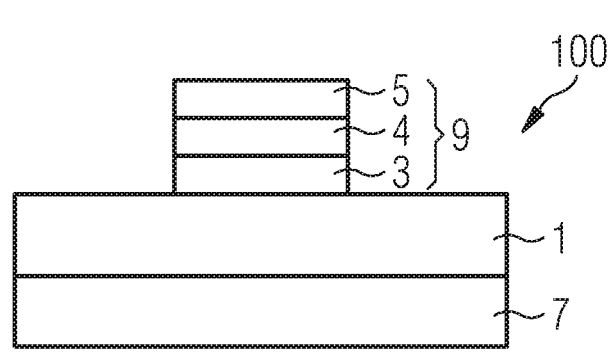

According to FIG. 1A, a carrier 7 is provided. The carrier 7 may, for example, be made of sapphire.

A semiconductor layer sequence 1 is applied on the carrier 7. The semiconductor layer sequence 1 is adapted for radiation emission. The semiconductor layer sequence emits radiation from the IR, UV and/or visible wavelength range. The semiconductor layer sequence 1 comprises at least one n-doped semiconductor layer 11, at least one p-doped semiconductor layer 12 and an active layer 13 arranged between the n- and p-doped semiconductor layers 11, 12.

According to FIG. 1B, a contact layer 3 may be applied on the semiconductor layer sequence 1. In particular, the contact layer 3 is applied directly onto the semiconductor layer sequence 1. In particular, the contact layer is applied in a structured fashion. This structuring may be carried out by flat application of the contact layer 3 onto the semiconductor layer sequence 1 and subsequent structuring, for example by means of etching, a photoresist mask or wet chemical liftoff.

The contact layer 3 prevents or reduces diffusion of the material of a mirror layer 4, which is applied according to FIG. 1C onto the contact layer 3, such as directly. The contact layer 3 may, for example, be formed from zinc oxide. The mirror layer 4 may, for example, be formed from silver.

As an alternative or in addition, instead of preventing or reducing diffusion of the material of a mirror layer, the contact layer may on the one hand influence the growth behavior and the crystal orientation of further layers, and on the other modify the species involved in contact in their composition.

In a subsequent method step, as shown in FIG. 1D, a barrier layer 5 may be applied directly onto the mirror layer 4. The contact layer and the barrier layer may comprise the same material or different materials. For example, the contact layer and barrier layer may be formed from zinc oxide. As an alternative, the contact layer may be formed from zinc oxide and the barrier layer from titanium-tungsten. The contact layer 3, the mirror layer 4 and the barrier layer 5 form a first mirror element 9.

Figure 2:
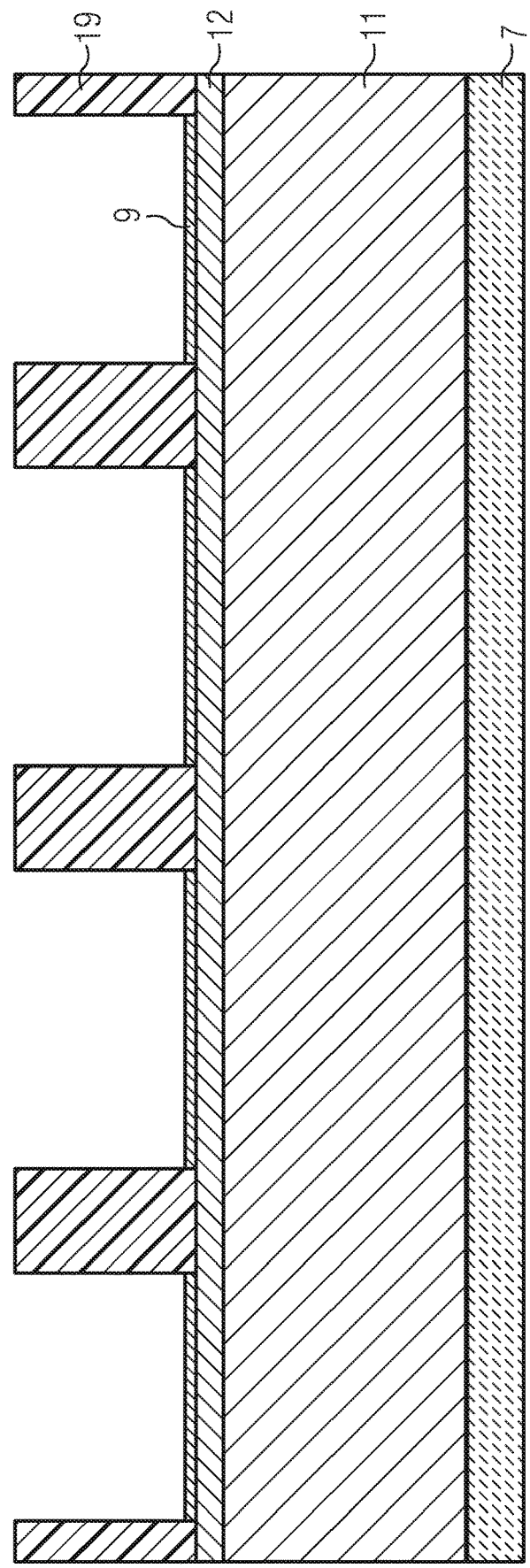
FIGS. 2A to 2Z show a method for producing an optoelectronic component.
Figure 2:
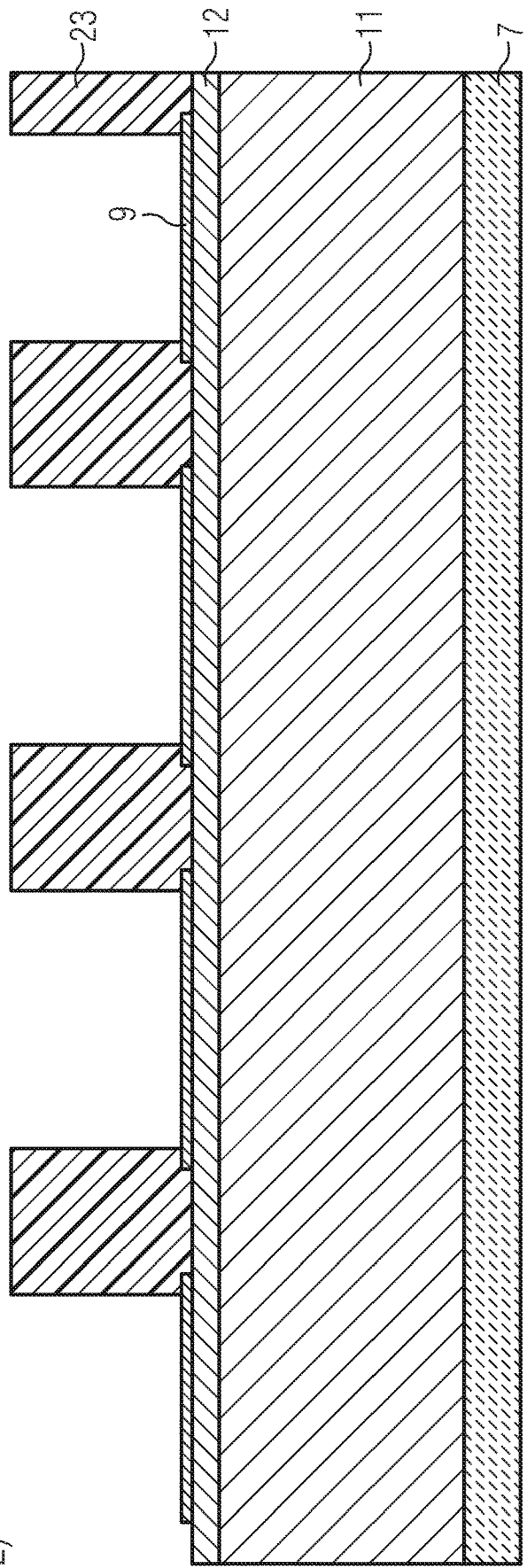
Figure 2:
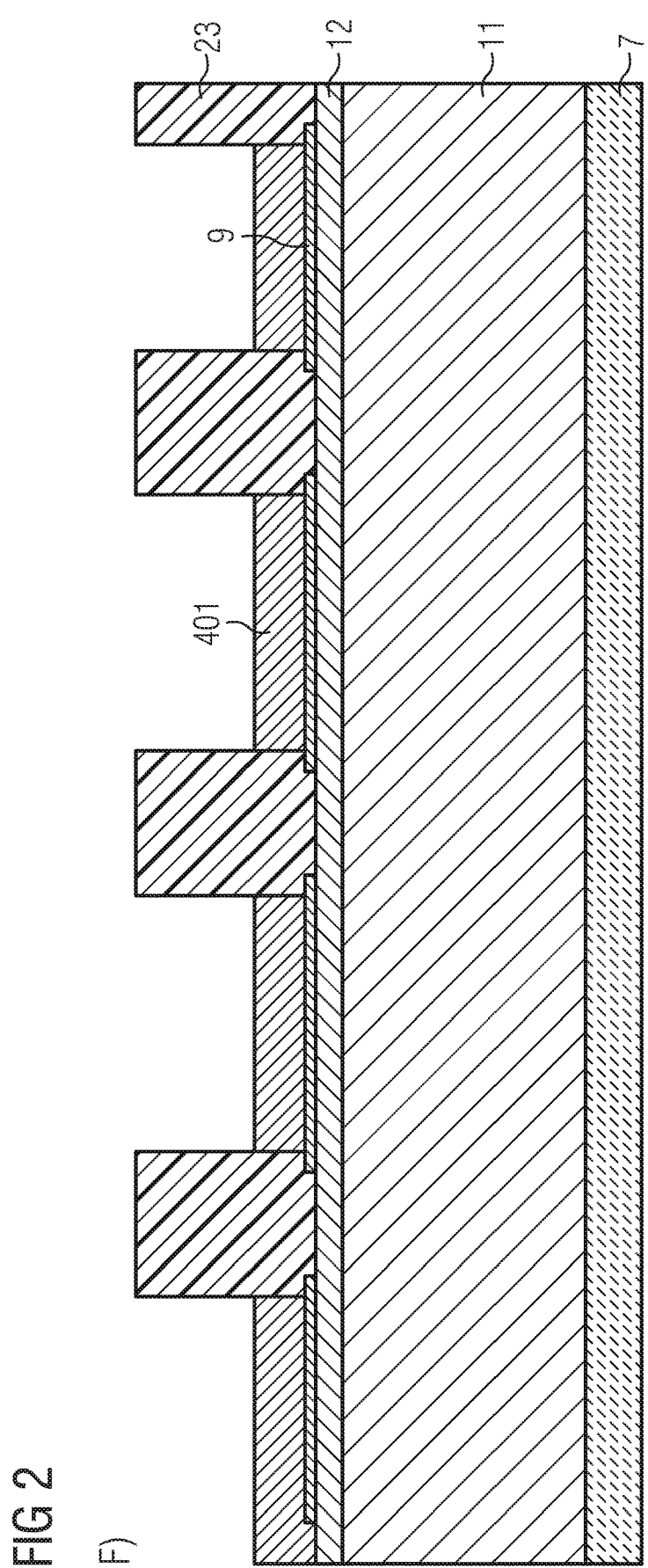
Figure 2:
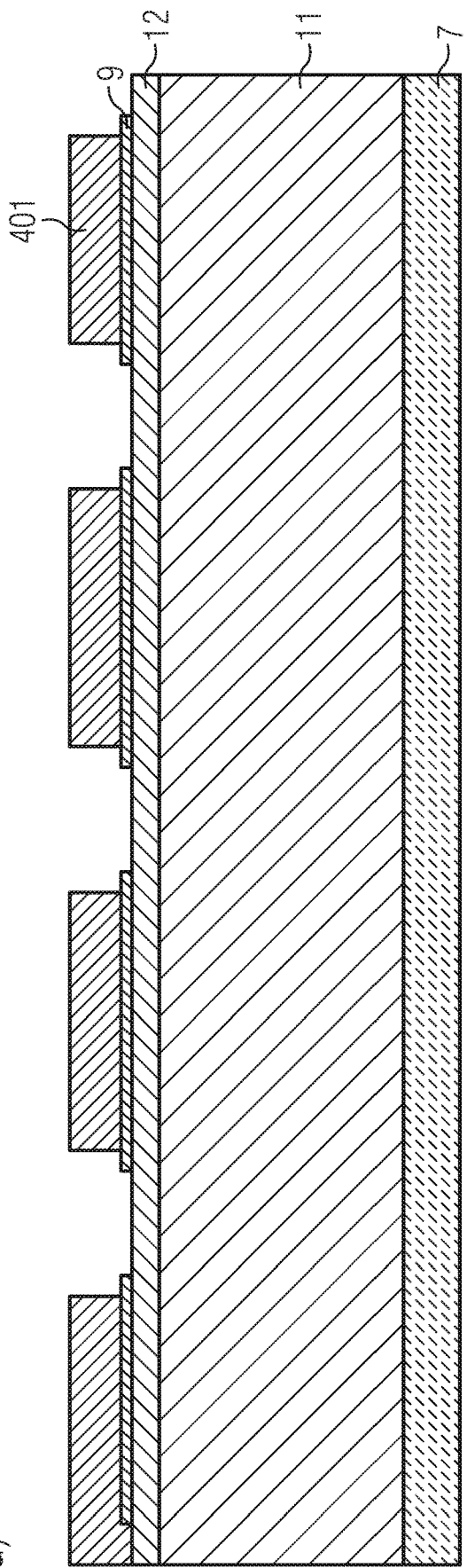
Figure 2:
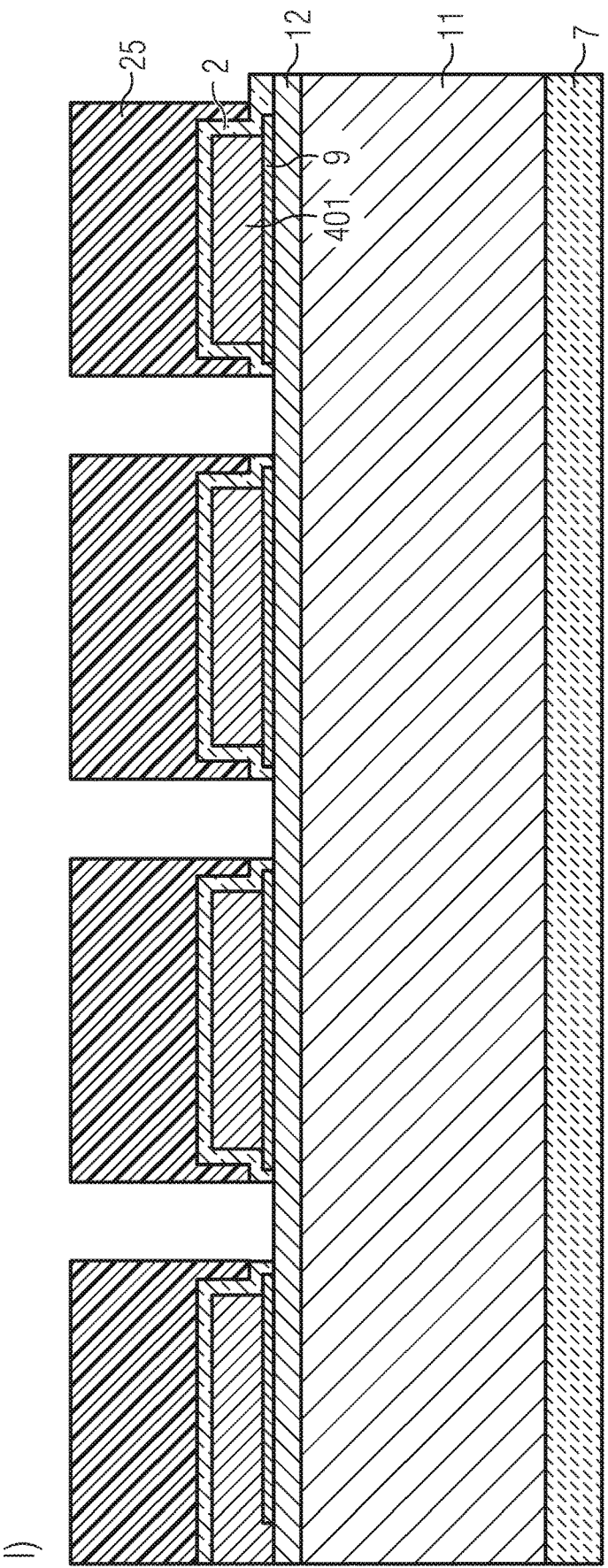
Figure 2:
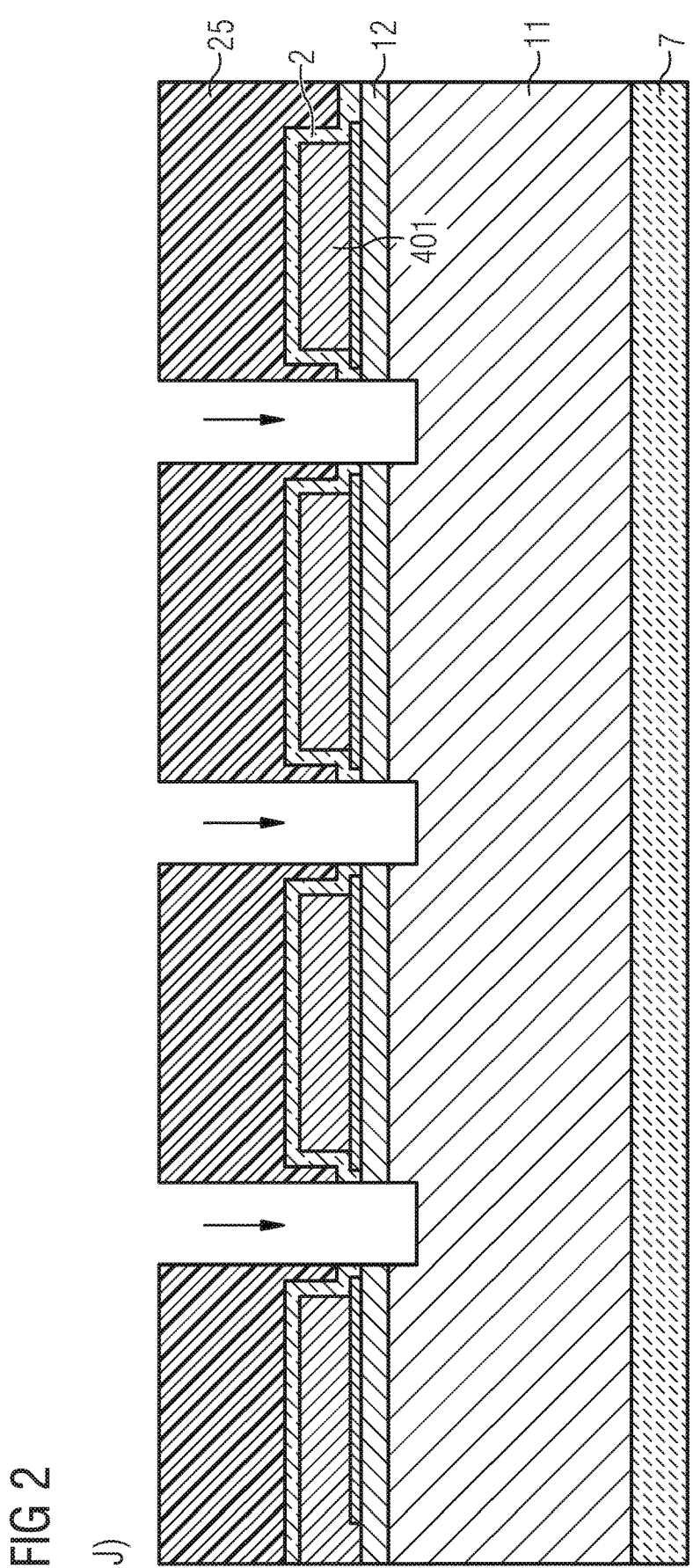
Figure 2:
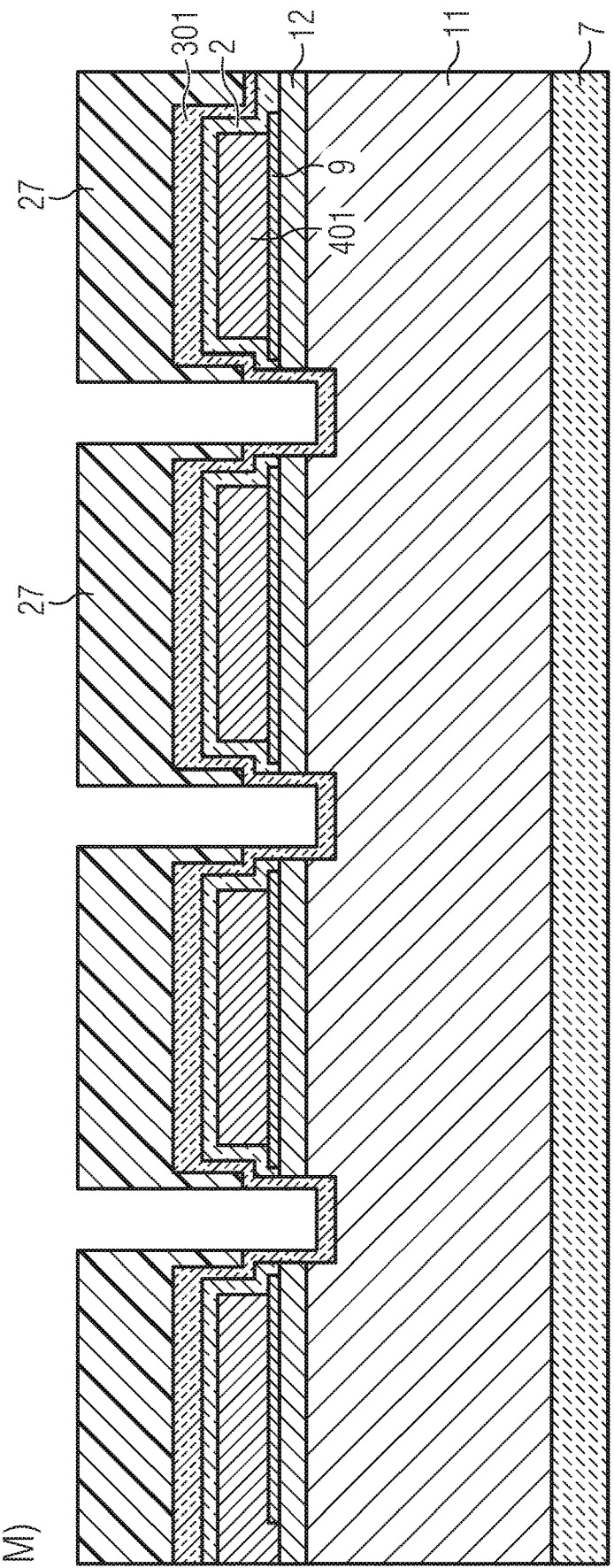
Figure 2:
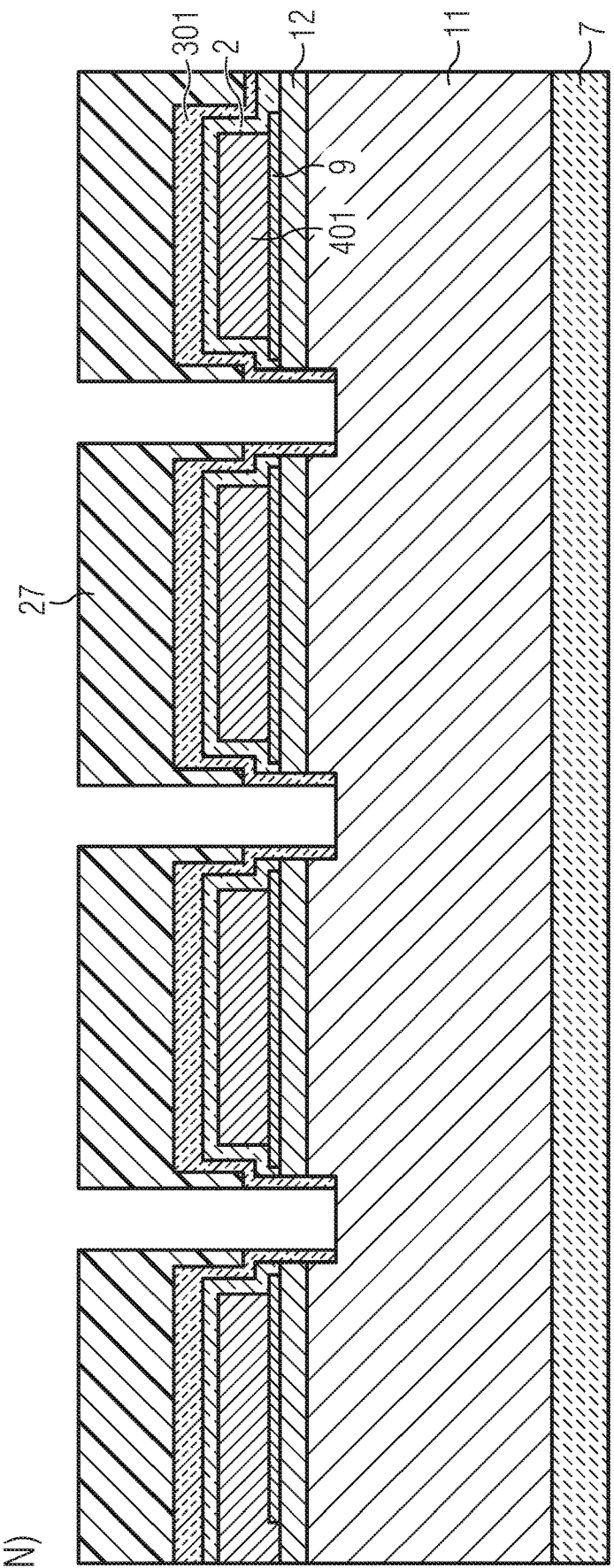
Figure 2:
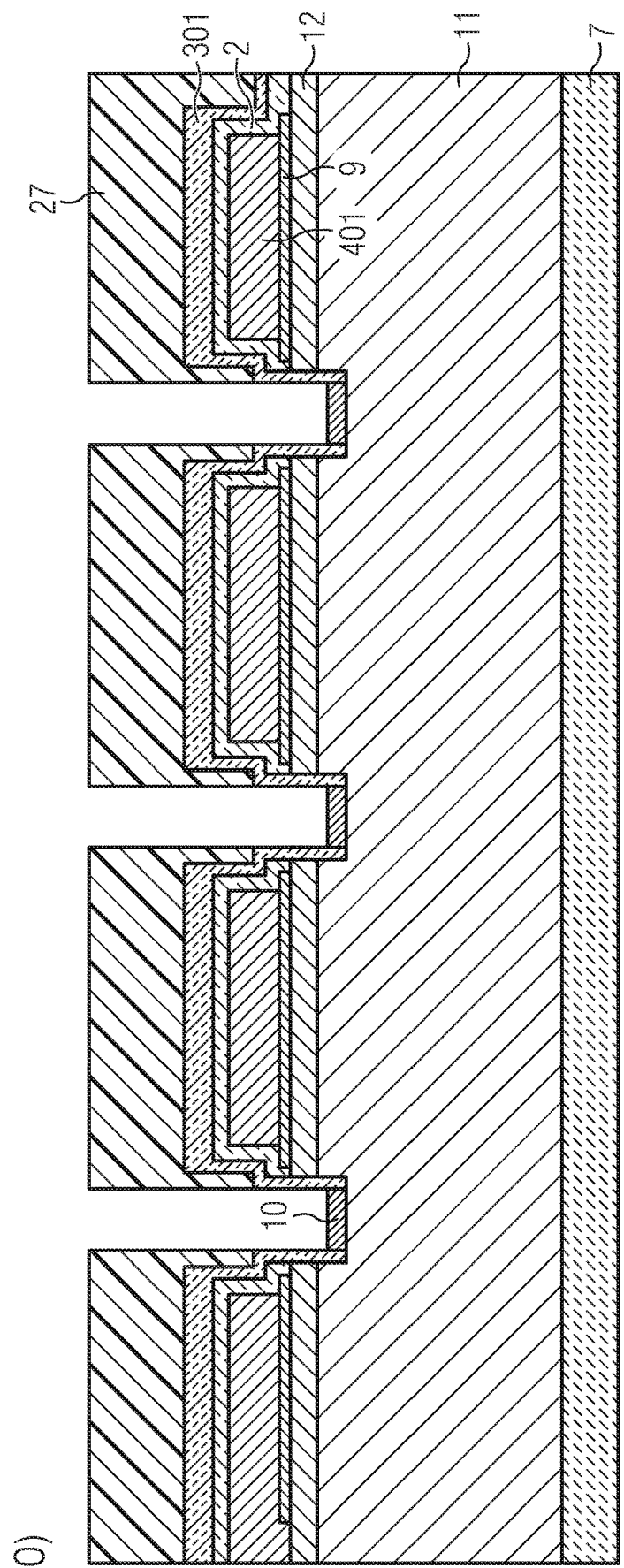

FIGS. 2A to 2Z show a method for producing an optoelectronic component. The method for p-contact deposition, for example the method of FIGS. 1A to 1D or the method of FIGS. 3A to 3D, may be integrated into this method. As an alternative, the method for p-contact deposition may also be integrated into other process flows, such as a method of thin-film technology.

FIG. 2A shows the provision of a carrier 7, on which an n-doped semiconductor layer 11, an active layer 13 (not shown here) and a p-doped semiconductor layer 12 are applied.

Subsequently, photostructuring may be carried out with a first mask 19, shown in FIG. 2B.

Subsequent to this, as shown in FIG. 2C, a first mirror element 9 may be applied in regions which are not covered by the first mask 19 on the p-doped semiconductor layer 12. The first mirror element 9 may, for example, be produced by the method according to FIGS. 1B to 1D.

In the subsequent method step, as shown in FIG. 2D, the first mask 19 may be removed by means of a removal method, such as a resist strip or wet chemical liftoff.

Subsequently, as shown in FIG. 2E, a second photomask 23 may be applied. The second photomask 23 may be used to produce the first metallization 401 (p-metallization).

FIG. 2F shows the application of the first metallization 401, which may in particular comprise platinum, gold and titanium. The first metallization 401 is applied between the second mask 23 and the first mirror element 9.

In the subsequent method step, as shown in FIG. 2G, the second mask 23 may be removed by means of a removal method, such as a resist strip or wet chemical liftoff.

Subsequently, as shown in FIG. 2H, a first insulation layer 2 may be applied surface-wide onto the p-doped semiconductor layer 12. The first insulation layer 2 in this case typically corresponds to a double layer consisting of two insulation materials, such as silicon oxide and silicon nitride.

Subsequently, as shown in FIG. 2I, a next photostructuring step may be carried out. To this end, a third mask 25 may be applied.

Subsequently, as shown in FIG. 2J, the regions not covered by the third photomask 25 may be removed. The p-doped semiconductor layer 12 and the n-doped semiconductor layer 11 are therefore exposed by means of plasma etching.

Subsequently, the third mask 25 may be removed by means of a removal method, such as a resist strip or wet chemical liftoff (see FIG. 2K).

Subsequently, as shown in FIG. 2L, a second insulation layer 301 is applied surface-wide. The second insulation layer 301 may be multiple layers and consist of three layer sequences, each layer consisting of silicon nitride and silicon oxide.

In FIG. 2M, it is shown that a further photostructuring step may be carried out. To this end, a fourth photomask 27 may be applied. This is used to produce the second mirror element 10 for the n-doped semiconductor layer 11.

FIG. 2N shows the structuring step by means of etching, and FIG. 2O shows the application of the second mirror element 10 in the previously structured regions.

The second mirror element 10 may typically be formed from zinc oxide and silver.

Subsequently, as shown in FIG. 2P, the fourth mask 27 may be removed.

Figure 2R:
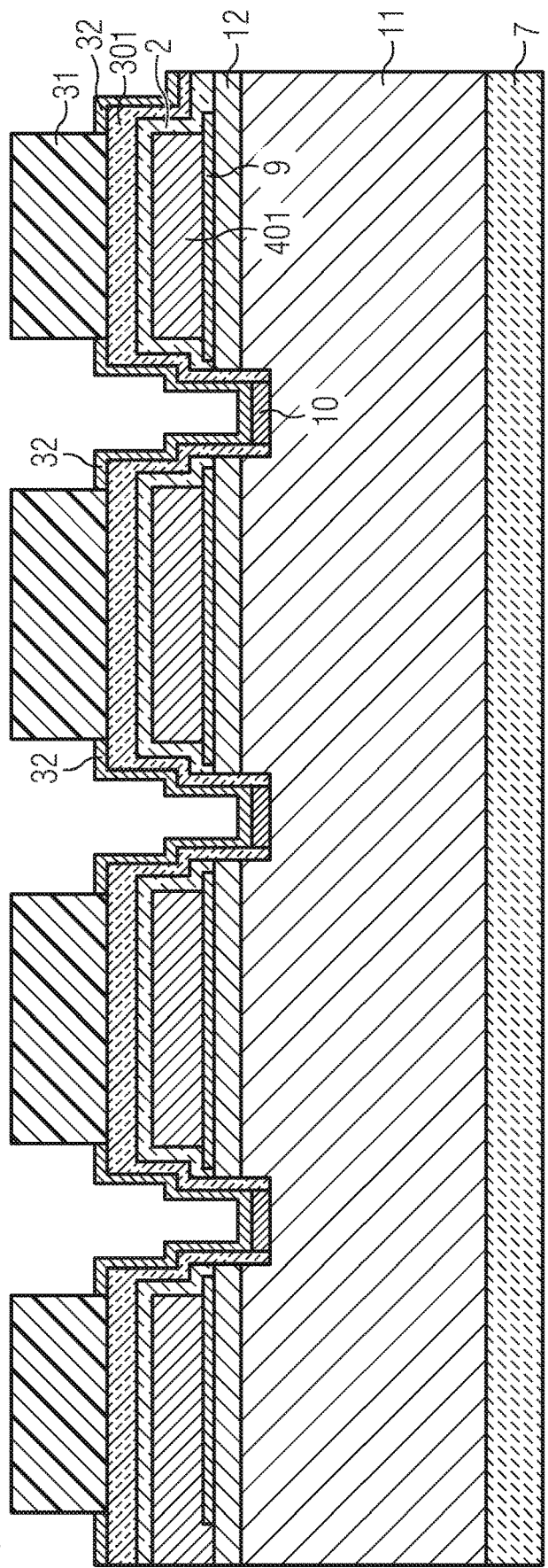
Figure 2:
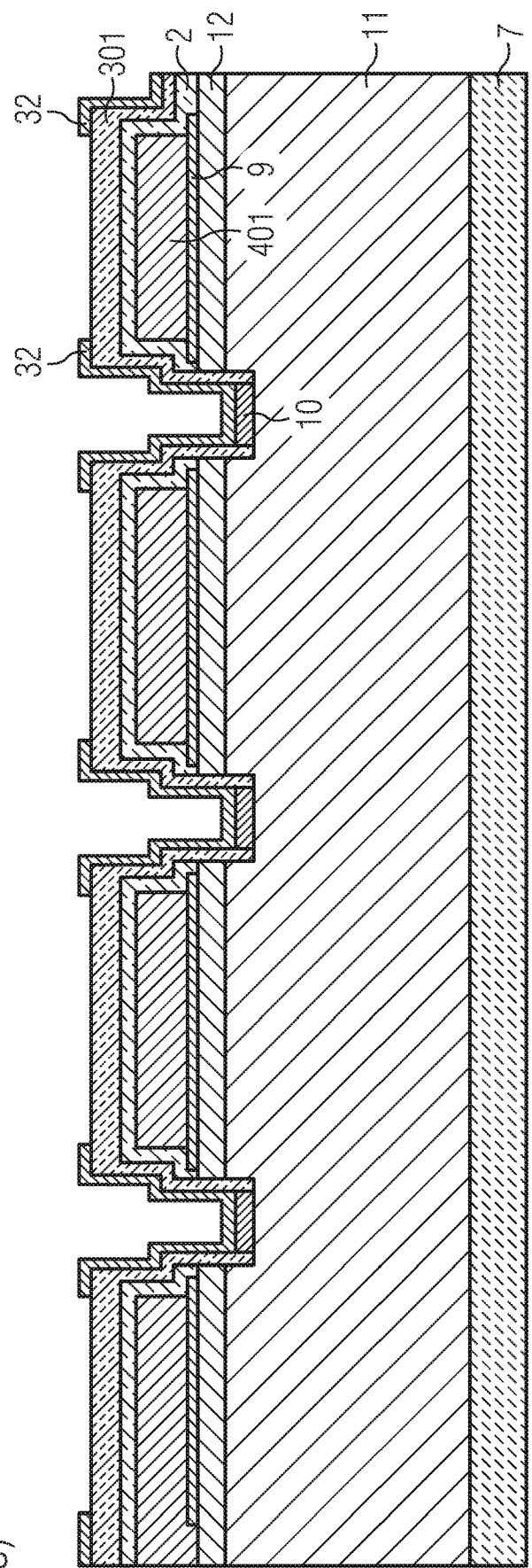
Figure 2:
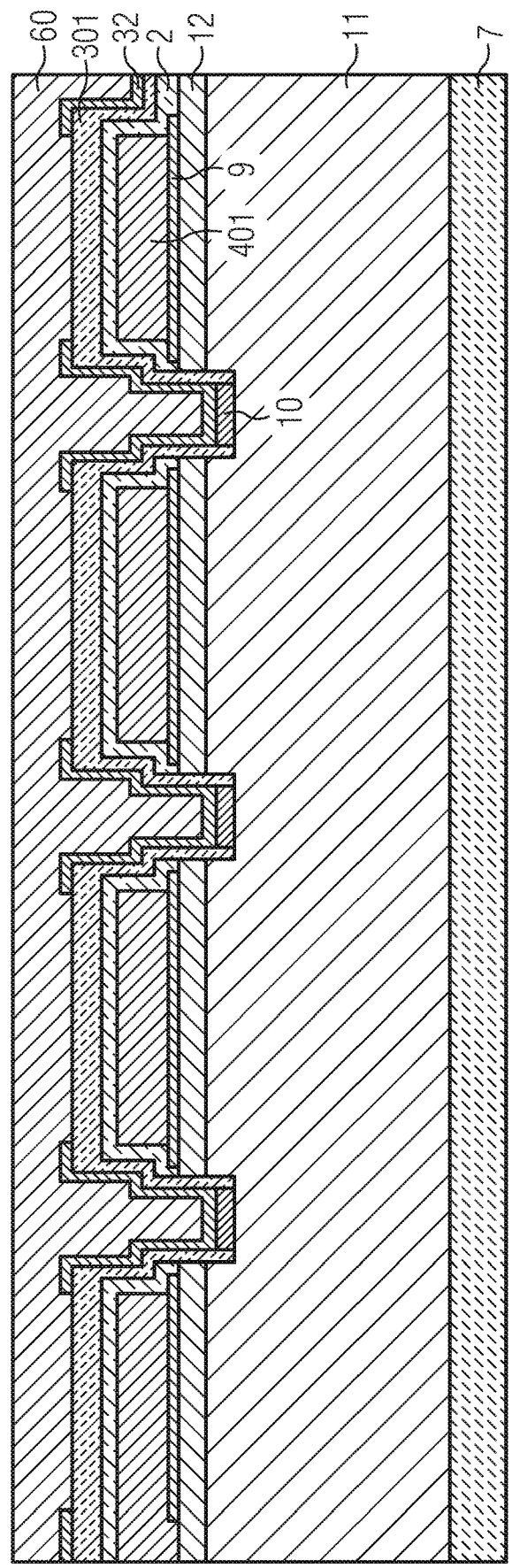
Figure 2:
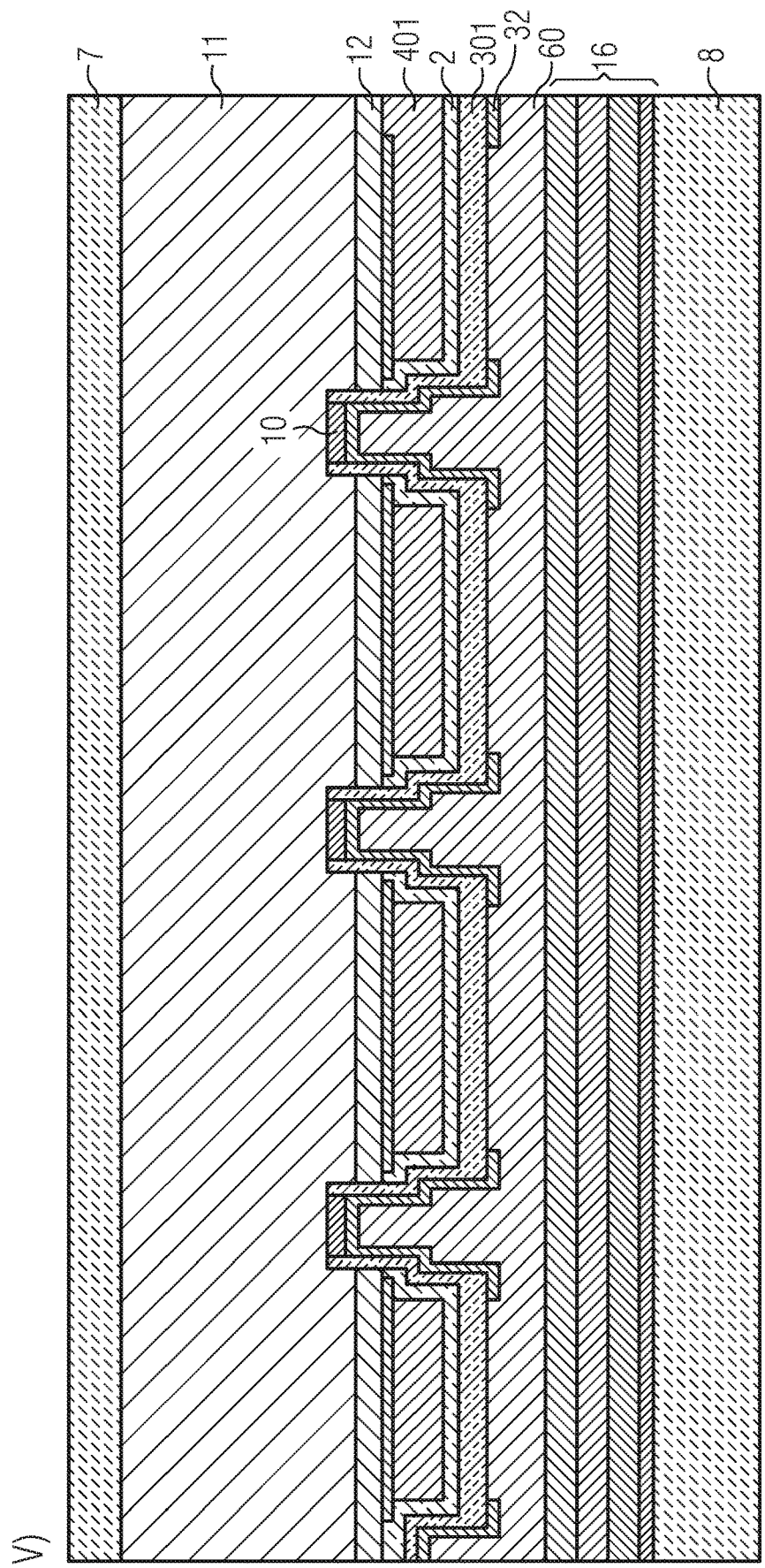

Subsequently, as shown in FIG. 2Q, a further photostructuring step may be carried out by means of a fifth mask 31. The structuring is used to apply a so-called combo mirror 32 (see FIGS. 2R and 2S). The combo mirror 32 may, for example, be of TiAgPtTi. The combo mirror 32 is applied in the previously structured regions onto the second mirror element 10.

Subsequently, the fifth mask may be removed, as shown in FIG. 2S. The removal may be carried out by means of a removal method, such as a resist strip or wet chemical liftoff.

In a subsequent method step, shown in FIG. 2T, the third metallization 60 for contacting the n-doped semiconductor layer 11 may be applied surface-wide. The third metallization 60 may comprise titanium, platinum, gold and nickel.

Subsequently, the contact metallization 16 as is shown in FIG. 2U, may be applied.

The contact metallization may consist of a layer structure, which comprises for example a first layer of titanium, nickel, tin and gold, a second layer of titanium, tungsten and nickel, a third layer of gold and a fourth layer of platinum.

The component may comprise a substrate 8, as shown in FIG. 2U. The substrate 8 may be formed from silicon.

FIG. 2V differs from FIG. 2U by its spatial orientation.

Subsequently, as shown in FIG. 2W, the carrier 7 may be removed.

Subsequently, as likewise shown in FIG. 2W, a mesa trench 15 may be introduced inside the n-doped semiconductor layer 11.

FIG. 2X shows the roughening 17 of the n-doped semiconductor layer 11 and the application of a passivation layer 18. The passivation layer 18 may be opened again (see FIG. 2Y). A contact pad 30 (pad metallization) (see FIG. 2Z) may be introduced into this opening 29.

The result is a component which is also known as a so-called UX3 chip.

FIGS. 3A to 3D show a method for producing an optoelectronic component according to one embodiment.

Figure 3:
FIGS. 3A to 3D show a method for producing an optoelectronic component according to one embodiment.
Figure 3:
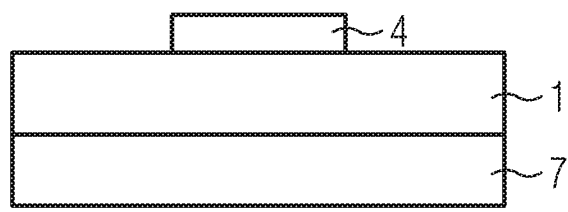
Figure 3:
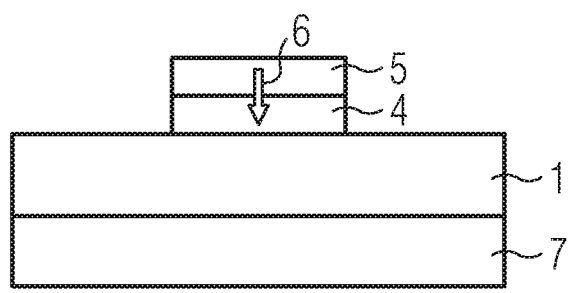
Figure 3:
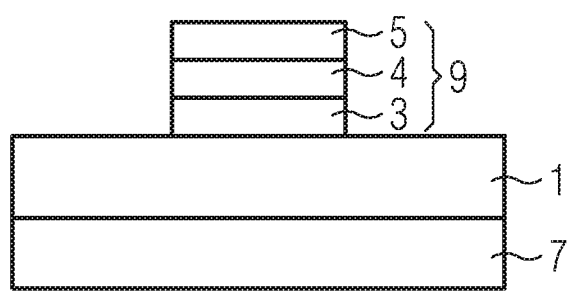

According to FIG. 3A, a carrier 7, for example consisting of sapphire, is provided, on which a semiconductor layer sequence 1 is arranged. With regard to the semiconductor layer sequence 1, reference is made to the comments above.

According to FIG. 3B, the mirror layer 4 may be applied directly onto the semiconductor layer sequence 1. In particular, the mirror layer 4 is applied directly and in a structured fashion onto the semiconductor layer sequence 1. Subsequently, a barrier layer 5, for example of zinc oxide, may be applied directly onto the mirror layer 4. The barrier layer 5 comprises a transparent conductive oxide, for example zinc oxide.

Subsequently, a heat-treatment step may be carried out so that the arrangement shown in method step C) or in FIG. 3C is heated. The heating may, for example, be carried out at temperatures of more than 200° C. with or without addition of $O_2$.

By heat-treatment, the transparent conductive oxide of the barrier layer 5 diffuses through the mirror layer 4 and accumulates as a layer on the semiconductor layer sequence 1, in particular directly on the semiconductor layer sequence 1.

A contact layer 3 is therefore formed, as is shown 3D.

The contact layer 3 comprises, in particular, the same material as the barrier layer 5. The concentration of the material of the contact layer 3 and of the barrier layer 5 may be the same or different.

The contact layer 3 has a layer thickness of at most 10 nm. In a non-limiting embodiment, the contact layer 3 is configured as a monolayer. The surface-wide monolayer may be formed in a structured fashion. A surface-wide monolayer is in this case intended to mean that the monolayer which is formed below the mirror element is arranged surface-wide below the mirror element. In other words, the monolayer is formed continuously and homogeneously below the mirror element.

In particular, the layer thickness of the contact layer is less than the layer thickness of the barrier layer. In a non-limiting embodiment, the layer thickness of the contact layer differs from the layer thickness of the barrier layer by the factor 1/20.

The exemplary embodiments described in connection with the figures and their features may also be combined with one another according to further exemplary embodiments, even if such nominations are not explicitly shown in the figures. Furthermore, the exemplary embodiments described in connection with the figures may comprise additional or alternative features according to the description in the general part.

This patent application claims the priority of German Patent Application 10 2017 123 154.4, the disclosure content of which is incorporated here by back reference.

The description with the aid of the exemplary embodiments does not restrict the invention to these exemplary embodiments. Rather, the invention comprises any new feature and any combination of features, which includes in particular any combination of features in the patent claims, even if this feature or this combination is not itself explicitly indicated in the patent claims or the exemplary embodiments.

LIST OF REFERENCES 100 optoelectronic component
1 semiconductor layer sequence
2 first insulation layer
3 contact layer
5 mirror layer
5 barrier layer
6 diffusion
7 carrier
8 substrate
9 first mirror element
10 second mirror element
11 n-doped semiconductor layer
12 p-doped semiconductor layer
13 active layer
15 trench or mesa trench
16 contact metallization
17 roughening
18 passivation layer
19 first mask
20 dielectric
23 second mask
25 third mask
27 fourth mask
29 structuring/opening
30 pad-metallization
31 fifth mask
32 combo mirror
60 third metallization
301 second insulation layer
401 first metallization (p-metallization)

The invention claimed is:

1. A method for producing an optoelectronic component; wherein the method comprises:
providing a semiconductor layer sequence on a carrier, the semiconductor layer sequence configured for radiation emission, the semiconductor layer sequence comprising at least one n-doped semiconductor layer, at least one p-doped semiconductor layer, and an active layer arranged between the n-and p-doped semiconductor layers;
applying a contact layer directly onto the semiconductor layer sequence, the contact layer having a layer thickness of at most 10 nm, wherein the contact layer reduces diffusion of the material of a mirror layer to the semiconductor layer sequence;
structuring the contact layer by etching, a photoresist mask, or a wet chemical liftoff;
applying the mirror layer directly onto the contact layer; and
applying a barrier layer directly onto the mirror layer;
wherein:
the contact layer comprises zinc or zinc oxide,
the mirror layer comprises silver, the contact layer being used as a growth layer for the mirror layer and therefore influencing the grain size distribution and orientation of the mirror layer;
the contact layer and the barrier layer have different material compositions; and
the barrier layer comprises a conductive metal nitride, wherein the contact layer, the mirror layer, and the barrier layer form a first mirror element; and wherein the mirror element is configured as a p-terminal contact for contacting of the p-doped semiconductor layer; and
forming a second mirror element in one or more structured regions of the n-doped semiconductor layer,
wherein the method further comprises:
forming a combo mirror element in one or more structured region of the n-doped semiconductor layer directly on the second mirror element; and
applying a surface-wide metallization contacting the n-doped semiconductor layer through the combo mirror element and the second mirror element.

2. The method as claimed in claim 1, wherein the contact layer is used as a growth layer for the mirror layer.

3. The method as claimed in claim 1, wherein the layer thickness of the contact layer is less than the layer thickness of the barrier layer.

4. The method as claimed in claim 1, wherein the layer thickness of the contact layer is less than the layer thickness of the barrier layer at least by the factor $1/20$.

5. The method as claimed in claim 1, wherein the layer thickness of the contact layer ranges from 0.05 nm to 3 nm.

6. The method as claimed in claim 1, wherein the contact layer comprises a transparent conductive oxide or a metal.

7. The method as claimed in claim 1, wherein the contact layer comprises zinc oxide.

8. The method as claimed in claim 1, wherein the contact layer comprises zinc.

9. The method as claimed in claim 1, wherein the contact layer is configured as a surface-wide monolayer.

10. The method as claimed in claim 1, wherein the contact layer is applied directly onto the p-doped semiconductor layer, the contact layer being directly followed by the mirror layer; and further comprising structuring the mirror layer in the same manner as the contact layer.

11. The method as claimed in claim 1, wherein the mirror layer comprises a reflective metal.

12. The method as claimed in claim 1, wherein the semiconductor layer sequence comprises indium gallium nitride or gallium nitride.

13. The method as claimed in claim 1, wherein applying the contact layer occurs by sputtering.

* * * * *